US008432132B2

(12) United States Patent
Nakanishi

(10) Patent No.: US 8,432,132 B2
(45) Date of Patent: Apr. 30, 2013

(54) BATTERY PACK MANAGER

(75) Inventor: Toshiaki Nakanishi, Toyohashi (JP)

(73) Assignee: Primearth EV Energy Co., Ltd., Kosai-shi (JP)

( * ) Notice: Subject to any disclaimer, the term of this patent is extended or adjusted under 35 U.S.C. 154(b) by 462 days.

(21) Appl. No.: 12/893,623

(22) Filed: Sep. 29, 2010

(65) Prior Publication Data
US 2011/0080138 A1    Apr. 7, 2011

(30) Foreign Application Priority Data

Oct. 5, 2009 (JP) .................................. 2009-231369
Jun. 18, 2010 (JP) .................................. 2010-139817

(51) Int. Cl.
*H02J 7/00* (2006.01)
(52) U.S. Cl.
USPC ........... 320/116; 320/118; 320/122; 320/132; 320/134; 320/162
(58) Field of Classification Search ............ 320/116
See application file for complete search history.

(56) References Cited

U.S. PATENT DOCUMENTS

| 2006/0012337 A1 | 1/2006 | Hidaka |
| 2007/0120529 A1* | 5/2007 | Ishikawa et al. .............. 320/119 |
| 2007/0268000 A1 | 11/2007 | Kobayashi |
| 2007/0279003 A1* | 12/2007 | Altemose et al. ............. 320/118 |

FOREIGN PATENT DOCUMENTS

| JP | 2006-29895 A | 2/2006 |
| JP | 2007-282413 A | 10/2007 |

* cited by examiner

*Primary Examiner* — Edward Tso
*Assistant Examiner* — Johali Torres Ruiz
(74) *Attorney, Agent, or Firm* — Christensen O'Connor Johnson Kindness PLLC

(57) ABSTRACT

A manager that lessens a difference in state of charge of a battery pack. The battery pack is constituted of a plurality of blocks. A slave unit is provided for each of the blocks, to thus detect a terminal voltage of the block and supply the detected terminal voltage to a master unit. A difference arises in state of charge among the blocks for reasons of a difference in current consumption of the respective slave units. The master unit makes up an operation clock signal for each of the slave units from a high frequency signal and a low frequency signal. A difference in state of charge among the blocks is lessened by controlling an appearance ratio of the high frequency signal to the low frequency signal for each of the slave units.

9 Claims, 20 Drawing Sheets

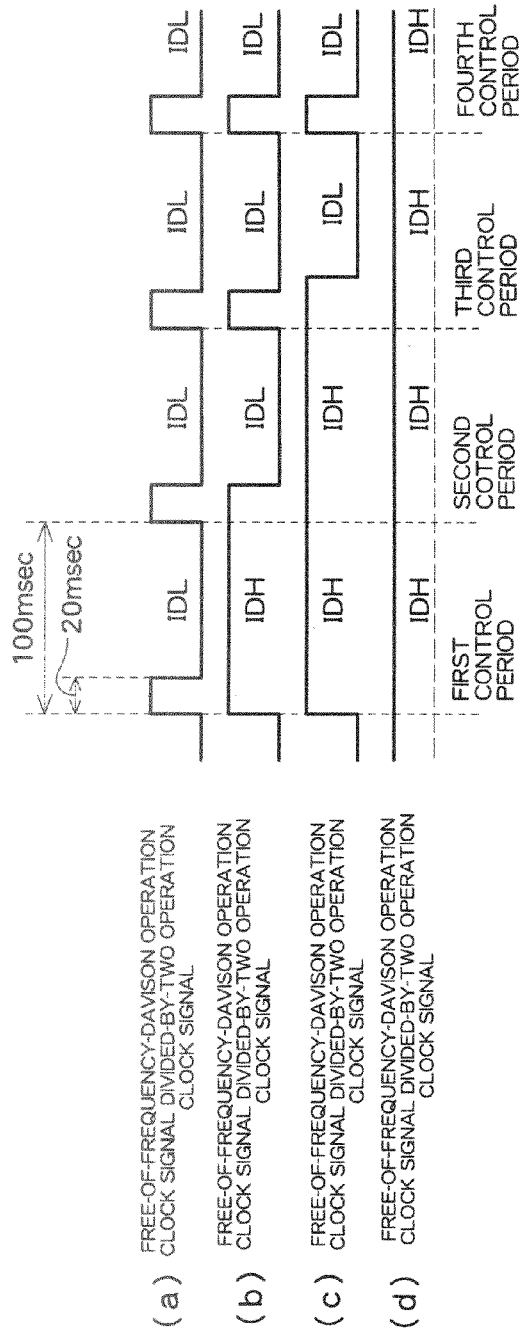

FIG.14

| | | AVERAGE CONSUMED CURRENT VALUE IDp ACQUIRED WHEN PROCESSING IS PERFORMED BY USE OF MAP [mA] | | | | | | DIFFERENCE BETWEEN AVERAGE CONSUMED CURRENT OF SLAVE UNIT M6 ACQUIRED WHEN PROCESSING IS PERFORMED BY USE OF MAP AND AVERAGE CONSUMED CURRENT VALUE OF SLAVE UNITS M1 TO M6 [mA] | | | | | |
|---|---|---|---|---|---|---|---|---|---|---|---|---|---|
| | | SLAVE | | | | | | SLAVE | | | | | |
| | | M1 | M2 | M3 | M4 | M5 | M6 | M1 | M2 | M3 | M4 | M5 | M6 |
| p | 1 | 0.660 | 0.708 | 0.760 | 0.810 | 0.840 | 0.860 | 0.224 | 0.176 | 0.124 | 0.074 | 0.044 | 0.024 |
| | 2 | 0.672 | 0.720 | 0.772 | 0.822 | 0.852 | 0.872 | 0.212 | 0.164 | 0.112 | 0.062 | 0.032 | 0.012 |
| | 3 | 0.684 | 0.731 | 0.784 | 0.834 | 0.864 | 0.884 | 0.200 | 0.153 | 0.100 | 0.050 | 0.020 | 0.000 |
| | 4 | 0.696 | 0.743 | 0.796 | 0.846 | 0.876 | 0.896 | 0.188 | 0.141 | 0.088 | 0.038 | 0.008 | -0.012 |
| | 5 | 0.708 | 0.754 | 0.808 | 0.858 | 0.888 | 0.908 | 0.176 | 0.130 | 0.076 | 0.026 | -0.004 | -0.024 |
| | 6 | 0.720 | 0.766 | 0.820 | 0.870 | 0.900 | 0.920 | 0.164 | 0.118 | 0.064 | 0.014 | -0.016 | -0.036 |
| | 7 | 0.732 | 0.778 | 0.832 | 0.882 | 0.912 | 0.932 | 0.152 | 0.106 | 0.052 | 0.002 | -0.028 | -0.048 |
| | 8 | 0.744 | 0.789 | 0.844 | 0.894 | 0.924 | 0.944 | 0.140 | 0.095 | 0.040 | -0.010 | -0.040 | -0.060 |
| | 9 | 0.756 | 0.801 | 0.856 | 0.906 | 0.936 | 0.956 | 0.128 | 0.083 | 0.028 | -0.022 | -0.052 | -0.072 |
| | 10 | 0.768 | 0.812 | 0.868 | 0.918 | 0.948 | 0.968 | 0.116 | 0.072 | 0.016 | -0.034 | -0.064 | -0.084 |
| | 11 | 0.780 | 0.824 | 0.880 | 0.930 | 0.960 | 0.980 | 0.104 | 0.060 | 0.004 | -0.046 | -0.076 | -0.096 |
| | 12 | 0.792 | 0.836 | 0.892 | 0.942 | 0.972 | 0.992 | 0.092 | 0.048 | -0.008 | -0.058 | -0.088 | -0.108 |
| | 13 | 0.804 | 0.847 | 0.904 | 0.954 | 0.984 | 1.004 | 0.080 | 0.037 | -0.020 | -0.070 | -0.100 | -0.120 |
| | 14 | 0.816 | 0.859 | 0.916 | 0.966 | 0.996 | 1.016 | 0.068 | 0.025 | -0.032 | -0.082 | -0.112 | -0.132 |
| | 15 | 0.828 | 0.870 | 0.928 | 0.978 | 1.008 | 1.028 | 0.056 | 0.014 | -0.044 | -0.094 | -0.124 | -0.144 |
| | 16 | 0.840 | 0.882 | 0.940 | 0.990 | 1.020 | 1.040 | 0.044 | 0.002 | -0.056 | -0.106 | -0.136 | -0.156 |
| | 17 | 0.852 | 0.894 | 0.952 | 1.002 | 1.032 | 1.052 | 0.032 | -0.010 | -0.068 | -0.118 | -0.148 | -0.168 |
| | 18 | 0.864 | 0.905 | 0.964 | 1.014 | 1.044 | 1.064 | 0.020 | -0.021 | -0.080 | -0.130 | -0.160 | -0.180 |
| | 19 | 0.876 | 0.917 | 0.976 | 1.026 | 1.056 | 1.076 | 0.008 | -0.033 | -0.092 | -0.142 | -0.172 | -0.192 |
| | 20 | 0.888 | 0.928 | 0.988 | 1.038 | 1.068 | 1.088 | -0.004 | -0.044 | -0.104 | -0.154 | -0.184 | -0.204 |
| | 21 | 0.900 | 0.940 | 1.000 | 1.050 | 1.080 | 1.100 | -0.016 | -0.058 | -0.116 | -0.166 | -0.196 | -0.216 |

FIG. 15

| SLAVE | IDinitH [mA] | IDinitL [mA] | SELECTED PATTERN NO. p | AVERAGE CONSUMED CURRENT VALUE ACQUIRED AFTER PERFORMANCE OF PROCESSING BY USE OF MAP IDp [mA] |
|---|---|---|---|---|
| M1 | 0.900 | 0.600 | 20 | 0.888 |
| M2 | 0.940 | 0.650 | 16 | 0.882 |
| M3 | 1.000 | 0.700 | 11 | 0.880 |
| M4 | 1.050 | 0.750 | 7 | 0.882 |
| M5 | 1.080 | 0.780 | 5 | 0.888 |
| M6 | 1.100 | 0.800 | 3 | 0.884 |

FIG. 16

BATTERY PACK MANAGER

PRIORITY INFORMATION

This application claims priority to Japanese Patent Application Nos. 2009-231369, filed on Oct. 5, 2009 and 2010-139817, filed on Jun. 18, 2010, which are incorporated herein by reference in their entirety.

BACKGROUND

1. Technical Field

The present invention relates to a battery pack manager.

2. Background Art

A battery pack comprised of nickel-metal hydride batteries has hitherto been used as a power source for a motor in a motor vehicle, like a hybrid electric vehicle and a pure electric vehicle, or as a drive source for a load. A lithium ion battery exhibits higher energy density than that exhibited by other secondary batteries and is also superior to the other secondary batteries in terms of charge/discharge efficiency. For these reasons, substitution of the nickel-metal hydride batteries for lithium ion batteries is under consideration.

A battery pack built in a motor vehicle is made by connecting a plurality of blocks in series, and each of the blocks is further made by connecting a plurality of battery cells in series. In order to control a state of the battery pack or detect an anomaly in the battery pack, a manager is provided on a per-block basis, thereby detecting voltages of the battery cells.

JP 2006-29895 A discloses a required number of integrated circuits for monitoring a battery voltage that are used while connected in series with each other; namely, in a so-called stacked manner. Specifically, a first integrated circuit and a second integrated circuit are provided for series-connected eight battery cells. Provided that the first integrated circuit is a high level integrated circuit and that the second integrated circuit is a low level integrated circuit, each of the high level and low level integrated circuits has, as power terminals, a VDD terminal that is a terminal of the highest electric potential VDD and a VSS terminal that is a terminal of the lowest electric potential VSS. The VSS terminal of the high level integrated circuit and the VDD terminal of the low level integrated circuit are commonly connected together. By way of a resistive potential dividing circuit, a signal output terminal SOUT of the high level integrated circuit and a reference voltage terminal REFU of the low level integrated circuit are connected together between the high level integrated circuit and the low level integrated circuit. A divided potential output terminal of the resistive potential dividing circuit is connected to a signal input terminal SIN of the low level integrated circuit. The configuration makes it possible to transmit specifics of a cell anomaly detected by the high level integrated circuit to a controller by way of the low level integrated circuit.

JP 2007-282413 A provides a disclosure including: taking a voltage across both ends of battery cells of any block in a battery pack into a flying capacitor by means of selective activation of a switching element and further into a microcomputer; managing a state of the battery cells by a management unit provided on a per-block basis; and the respective management units performing processing for letting the battery cells discharge electricity.

Incidentally, the management unit (an integrated circuit) that detects a voltage of each of the blocks constituting the battery pack operates upon receipt of a power supply from a secondary battery that is an object of management. Because of a difference in electric consumption among the plurality of management units, a difference often arises in state of charge (SOC) among the blocks constituting the battery pack.

SUMMARY

The present invention provides a manger that lessens a difference in state of charge (SOC) or remaining capacity among respective blocks constituting a battery pack.

The present invention provides a manager that manages a state of charge of a battery pack, comprising: a plurality of low level control means that each individually control a plurality of series-connected battery blocks constituting the battery pack and that are supplied with electric power from each of the plurality of battery blocks; and high level control means that generate each of operation clock signals for the plurality of low level control means from at least two signals, or a high frequency signal and a low frequency signal, and that lessens a difference in state of charge among the battery blocks to be controlled by the plurality of corresponding low level control means by controlling an appearance ratio of the high frequency signal to the low frequency signal.

In one embodiment of the present invention, the plurality of low level control means detect terminal voltage of battery cells constituting each of the battery blocks to be controlled by the respective low level control means and supply the detected terminal voltages to the high level control means; and the high level control means detects a difference in state of charge from the terminal voltages of the battery blocks and controls the appearance ratio according to the difference in state of charge.

It is preferable that the high level control means should perform control operation so as to increase the appearance ratio of the high frequency signal in connection with low level control means that controls a battery block exhibiting a relatively higher state of charge.

In another embodiment of the present invention, the high level control means controls the appearance ratio according to a difference among consumed current values generated as a result of the plurality of low level control means operating by means of the high frequency signal.

The high level control means performs control operation in such a way that low level control means exhibiting a relatively greater consumed current value is given a greater appearance ratio of the low frequency signal.

The high level control means sets the appearance ratio of the low level control means, among the plurality of low level control means, that exhibits a relatively greater consumed current value generated as a result of the low level control means having operated by means of the high frequency signal and also sets the appearance ratio for the other low level control means such that a difference between an average consumed current value generated as a result of the low level control means having operated by means of the set appearance ratio and an average consumed current value of the other low level control means becomes minimum.

Further, the present invention also provides a manager for managing remaining capacity of a battery pack comprising: a plurality of low level control means that each individually control a plurality of series-connected battery blocks constituting the battery pack and that are supplied with electric power from each of the plurality of battery blocks; and high level control means that generates each of operation clock signals for the plurality of low level control means from at least two signals, or a high frequency signal and a low frequency signal, and that lessens a difference in remaining capacity among the battery blocks to be controlled by the plurality of corresponding low level control means by controlling an appearance ratio of the high frequency signal to the low frequency signal.

According to the present invention, it is possible to lessen a difference in state of charge (SOC) or remaining capacity among blocks in the battery pack attributable to a difference in current consumption among the plurality of low level control means The invention will be more clearly comprehended by reference to embodiments provided below. However, the scope of the invention is not limited to the embodiments.

BRIEF DESCRIPTION OF THE DRAWINGS

Preferred embodiments of the present invention will be described in detail by reference to the following drawings, wherein:

FIG. 12 is timing charts of a battery pack manager of a second embodiment;

FIG. 13 is a diagram pertaining to FIG. 12;

FIG. 14 is a view for describing patterns for IDH and IDL acquired over a plurality of control periods;

FIG. 15 is a view showing consumed current values acquired when control operation is performed according to a pattern map;

FIG. 16 is a descriptive view showing patterns selected by individual slave units and consumed current values resultant from selection of the patterns;

DETAILED DESCRIPTION

Embodiments of the present invention are hereinbelow described by reference to the drawings.

First Embodiment

Figure 1:
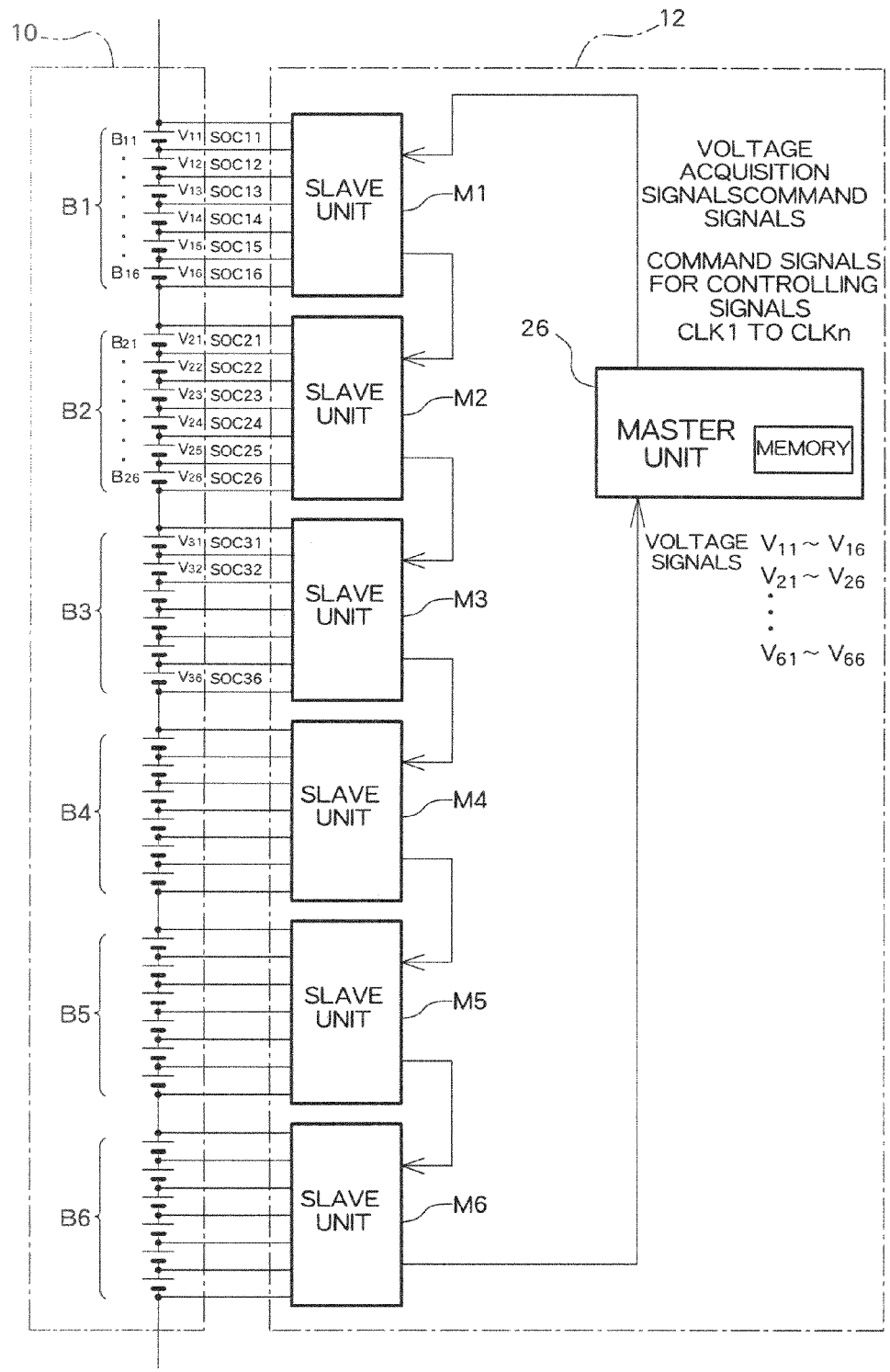
FIG. 1 is a structural block diagram of a battery pack manager of an embodiment.

FIG. 1 shows a structural block diagram of an entire battery pack manager of an embodiment. A manager 12 is provided for a battery pack 10.

The battery pack 10 is built by connecting a plurality of battery blocks B1 through B6 (the battery block will hereinbelow be referred to simply as "block Bi," where an alphabetical subscript "i" denotes a block number) in series. Further, each of the blocks B1 through B6 is built by connecting at least one battery cell (cell) or more in series. In the present embodiment, each of the blocks is comprised of six battery cells. For instance, the block B1 is built by connecting six battery cells B11 to B16 in series, and the block B2 is built by connecting six battery cells B21 to B26 in series. In a battery cell Bij, an alphabetical subscript "i" denotes a block number, and another alphabetical subscript "j" denotes a battery cell number in a block Bi. Therefore, a battery cell B44 shows a fourth battery cell in the block B4.

The manager 12 includes a master unit 26 serving as high level control means and a plurality of slave units Mi serving as low level control means that operate in accordance with a command from the master unit 26, where an alphabetical subscript "i" denotes a slave unit number that is identical with the block number. The slave units M1 to M6 are provided in a total number of six in correspondence with the respective blocks B1 to B6 of the battery pack 10, thereby controlling (managing) the respective blocks B1 to B6. Specifically, the slave unit M1 is provided for the block B1; the slave unit M2 is provided for the block B2; the slave unit M3 is provided for the block B3; the slave unit M4 is provided for the block B4; the slave unit M5 is provided for the block B5; and the slave unit M6 is provided for the block B6. Each of the slave units M1 through M6 detects terminal voltages of the respective battery cells in the block that is an object of management. A terminal voltage of the battery cell Bij is herein taken as Vij. The slave unit M1 detects terminal voltages V11 to V16 of the battery cells B11 to B16 in the block B1. A terminal voltage of the battery cell B11 is herein taken as V11; a terminal voltage of the battery cell B12 is taken as V12; and the same also applies to the other battery cells in the block. The slave unit M2 detects terminal voltages V21 to V26 of the battery cells B21 to B26 in the block B2. A terminal voltage of the battery cell B21 is herein taken as V21; and a terminal voltage of the battery cell B22 is taken as V22; and the same also applies to the other battery cells in the block. The slave unit M6 detects terminal voltages V61 to V66 of battery cells B61 to B66 in the block B6. A terminal voltage of the battery cell B61 is herein taken as V61; a terminal voltage of the battery cell B62 is taken as V62; and the same also applies to the other battery cells in the block.

The slave units M1 to M6 are connected together in series to each other (or in the form of a daisy chain connection). A terminal voltage is sequentially transmitted as digital data from the high level slave unit to the low level slave unit. In the following descriptions, for the sake of convenience, the slave unit M1 is taken as a high level slave unit, and the slave unit M6 is taken as a low level slave unit. In accordance with a voltage acquisition signal from the master unit 26, the slave unit M1 detects the respective terminal voltages V11 to V16 of the block B1 that is under management by the slave unit M1; outputs the thus-detected terminal voltages from an output terminal; and supplies the terminal voltages to an input terminal of the slave unit M2 that is a low level unit on the next stage. The slave unit M2 detects the respective terminal voltages V21 to V26 of the block B2 that is under management by the slave unit M2; outputs the thus-detected terminal voltages V21 to V26 from an output terminal along with the terminal voltages V11 to V16 supplied from the slave unit M1; and supplies the thus-output terminal voltages to an input terminal of the slave unit M3 that is a low level unit on the next stage. The slave unit M3 detects respective terminal voltages V31 to V36 of the block B3 that is under management by the slave unit M3; outputs the thus-detected terminal voltages V31 to V36 from an output terminal along with the terminal voltages V11 to V16 and V21 to V26 supplied from the slave unit M2; and supplies the thus-output terminal voltages to an input terminal of the slave unit M4 that is a low level unit on the next stage. The terminal voltages are likewise transmitted in sequence of the slave unit M1, the slave unit M2, the slave unit M3, the slave unit M4, the slave unit M5, and the slave unit M6. The slave unit M6 detects the respective terminal voltages V61 to V66 of the block B6 that is under management by the slave unit M6; outputs the thus-detected terminal voltages V61 to V66 from an output terminal along with the terminal voltages V11 to V16, V21 to V26, V31 to V36, V41 to V46, and V51 to V56 supplied from the slave unit M5; and supplies the thus-output terminal voltages to the master unit 26 as serial data.

The master unit 26 controls the slave units M1 to M6 in a centralized manner. The master unit 26 outputs a voltage acquisition signal at a predetermined timing to the slave units M1 to M6. The voltage acquisition signals are sequentially received by the respective slave units M1 to M6. According to the thus-received voltage acquisition signal, the respective slave units M1 to M6 detect terminal voltages of the blocks B1 to B6 that are under management of the slave units M1 to M6. The master unit 26 outputs to the respective slave units M1 to M6 a command signal (a clock control command value) that controls operation clock signals CLK for the respective slave units M1 to M6.

Specifically, the master unit 26 and the slave units M1 to M6 each are made up of single chip microcomputers. Specifically, a semiconductor chip of a microcomputer is placed on a circuit board packed in an individual package, and a temperature of the semiconductor chip can change according to a temperature distribution of the circuit board.

Figure 2:
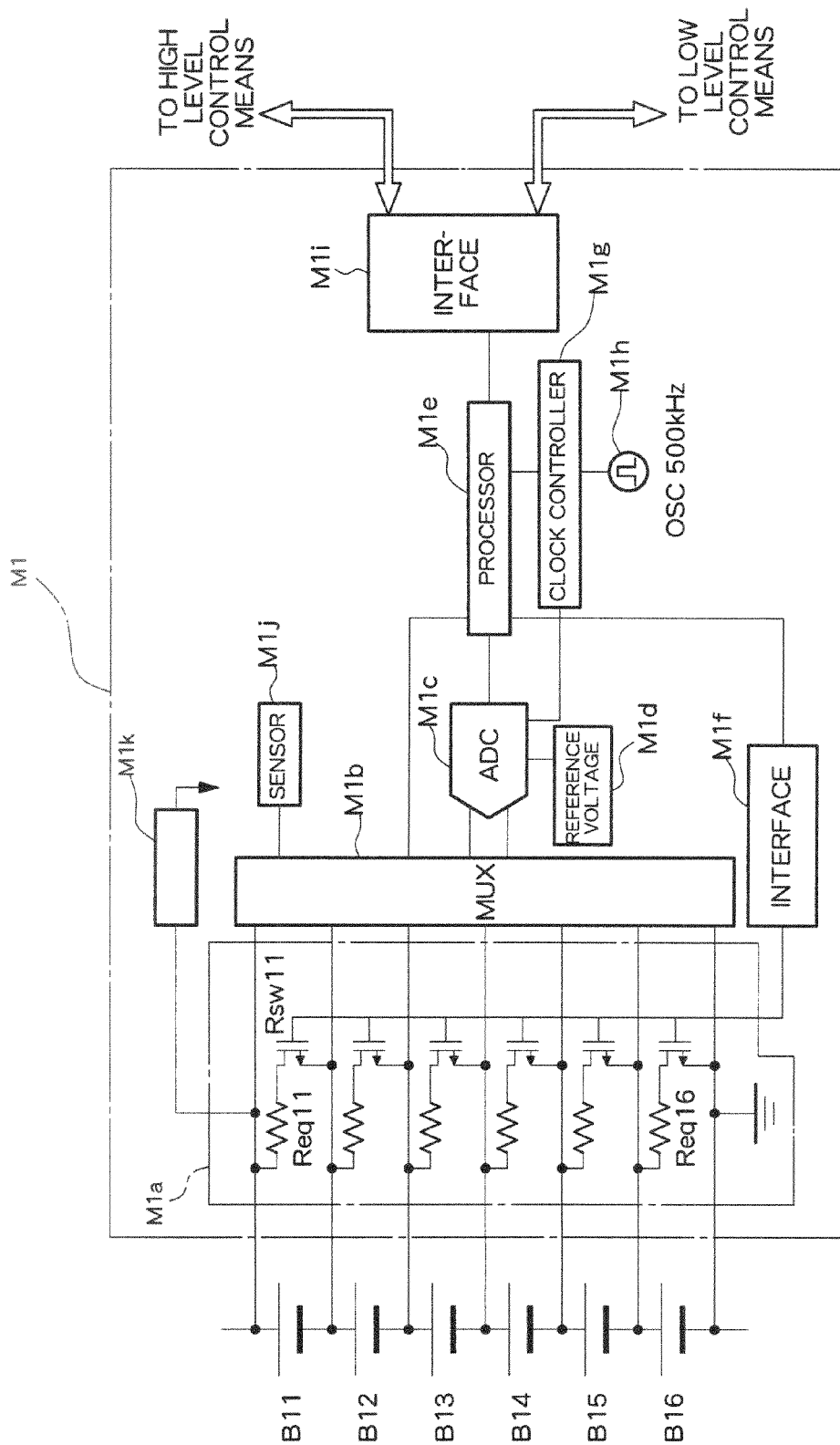
FIG. 2 is a structural block diagram of a slave unit M1 shown in FIG. 1.

FIG. 2 shows a structural block diagram of the slave unit M1 shown in FIG. 1. The other slave units M2 to M6 also have the same configuration.

The slave unit M1 has a discharge circuit M1a, a multiplexer (MUX) M1b, an analogue-to-digital converter (ADC) M1c, an oscillator (OSC) M1h, a clock controller M1g, a processor M1e, and interfaces M1f and M1i. The slave unit M1 operates upon receipt of power from the block B1 that is under management of the slave unit M1. The other slave units M2 to M6 are also configured likewise. The master unit 26 is supplied with power from an auxiliary power source of a system differing from the system for the battery pack 10.

The discharge circuit M1a lets the respective battery cells B11 to B16 of the block B1 discharge electricity, thereby equalizing the state of charge SOC (%) (hereinafter referred to simply as a "state of charge") of the respective battery cells B11 to B16. The discharge circuit M1a has a resistor Req connected to positive terminals of the respective battery cells and a switching transistor Rsw connected to the resistor. A collector terminal of the switching transistor Rsw is connected to the resistor, and an emitter terminal of the same is connected to negative terminals of the battery cells. A base terminal of the switching transistor is connected to the processor M1e by way of the interface M1f. When attention is paid to; for instance, the battery cell B11, a resistor Req 11 is connected to the positive terminal of the battery cell B11. The collector terminal of the switching transistor Rsw 11 is connected to the resistor Req 11. The emitter terminal of the switching transistor Rsw 11 is connected to the negative terminal of the battery cell B11. The base terminal of the same is connected to the processor M1e. When the switching transistor Rsw is turned on by a control signal from the processor M1e, the positive terminals and the negative terminals of the respective battery cells are short-circuited by way of the resistor Req. For instance, when the switching transistor Rsw 11 is turned on, the positive terminal and the negative terminal of the battery cell B11 are connected to each other by way of the resistor Req 11, whereupon the battery cell B11 discharges electricity. The discharge circuit M1a individually causes the battery cells B11 to B16 to discharge electricity by use of the resistor Req and the switching transistor Rsw connected to each of the battery cells. As a result of the battery cells B11 to B16 individually discharging electricity, the state of charge (SOC) of each of the battery cells can be changed, whereupon the state of charge (SOC) can eventually be equalized. For instance, the state of charge (SOC) of the battery cell B11 is higher than the states of charge (SOC) of the other battery cells, the battery cell B11 is caused to discharge electricity, whereby the state of charge (SOC) of the battery cell B11 is reduced. Equalization of the state of charge (SOC) can also be performed on a per-block basis. For instance, the state of charge (SOC) of the block B1 is higher than the states of charge of the other blocks, the battery cells B11 to B16 making up the block B1 are caused to discharge electricity, thereby diminishing the state of charge (SOC) of the block B1. When the battery pack 10 is built in a motor vehicle, such as a hybrid electric vehicle and a pure electric vehicle, processing for equalizing the states of charge (SOC) is performed during halting of the vehicle; namely, after the ignition has been turned off.

When the vehicle ignition is turned off, the master unit 26 outputs an equalization processing execution command to the respective slave units M1 to M6. In response to the command from the master unit 26, the processor M1e of the slave unit M1 controls activation or deactivation of the respective switching transistors Rsw of the discharge circuit M1a, thereby controlling an electric discharge. The master unit 26 determines whether or not to perform equalization processing, according to the terminal voltages V11 to V66 supplied from the respective slave units M1 to M6. Specifically, states of charge (SOC) of the respective blocks B1 to B6 are calculated from the terminal voltages V11 to V66, thereby determining whether or not a difference exists in the thus-calculated states of charge (SOC). When a difference is determined to exist, blocks to be caused to discharge electricity are selected form the blocks B1 to B6 so as to eliminate the difference, and the command is sent to the respective slave units M1 to M6. When the ignition is turned on, the master unit 26 performs, in connection with the respective blocks B1 to B6, calculation of the state of charge (SOC) and making of a determination as to whether or not a difference exists and whether or not to perform equalization processing. The respective slave units M1 to M6 perform actual equalization processing after the ignition has been turned off.

As mentioned previously, the slave unit M1 detects the terminal voltages V11 to V16 of the battery cells B11 to B16 in the block B1. The thus-detected terminal voltages V11 to V16 are supplied to the multiplexer (MUX) M1b.

A sensor M1j is a temperature sensor that supplies a band gap voltage to the multiplexer M1b in order to detect a temperature of an IC chip of the slave unit M1.

The multiplexer (MUX) M1b supplies these terminal voltages V11 to V16 and the chip temperature to the analogue-to-digital converter (ADC) M1c. By use of a reference voltage Vref from a reference voltage generator M1d and an operation clock signal supplied to the clock controller M1g, the analogue-to-digital converter (ADC) M1c converts the analogue terminal voltages V11 to V16 into digital voltage data V11 to V16 at the timing commanded by the voltage acquisition signal from the processor M1e, and outputs the digital voltage data as serial data to the processor M1e. Moreover, a band gap voltage of the chip measured by the sensor M1j is also converted into digital temperature data, and the digital temperature data are supplied to the processor M1e.

The processor M1e causes the analogue-to-digital converter (ADC) M1c to operate in response to the voltage acquisition signal supplied from the master unit 26 by way of the interface M1i, thereby acquiring the digital voltage data V11 to V16 and the digital temperature data pertaining to the chip; and outputs the thus-acquired data to a low level slave unit; that is, the slave unit M2 in the embodiment, by way of the interface M1i. The processor also activates the discharge circuit M1a by way of the interface M1f in response to the equalization command signal supplied from the master unit 26 by way of the interface M1i. The processor M1e operates by use of the operation clock signal CLK that has been generated by the oscillator (OSC) M1h and frequency-divided by the clock controller M1g. The operation clock signal CLK is brought into an ON or OFF state according to turning on or off of the ignition. Specifically, when the ignition is turned on, the processor M1e operates according to the operation clock signal CLK. On the contrary, when the ignition is turned off, the operation clock signal CLK is also brought into an OFF state, whereupon operation of the processor M1e comes to a stop.

As mentioned above, in response to the command from the master unit 26, the slave units M1 to M6 provided for the respective blocks B1 to B6 acquire the terminal voltages of the blocks B1 to B6 under management by the slave units M1 to M6 and temperatures of the chips and supply the thus-acquired voltages and the temperatures to the master unit 26. However, electric currents consumed by the respective slave units M1 to M6 are not always identical with each other. Consumed current values can change according to a difference in manufacturing process among the slave units M1 to M6, a difference in oscillation frequency among the slave units M1 to M6, and a difference in chip temperature among the slave units M1 to M6. The chips are semiconductors, and, in particular, an on-chip oscillator is susceptible to great changes in characteristics of the oscillation frequency due to a temperature. The respective slave units M1 to M6 operate by means of power from the respective blocks B1 to B6 under management by the slave units M1 to M6. Hence, when a difference arises in the electric currents consumed by the slave units M1 to M6, a difference will arise in amounts of electrical consumption even if the respective slave units M1 to M6 have operated in response to the single command from the master unit 26, so that the states of charge (SOC) of the respective blocks B1 to B6 will also change.

Figure 3:
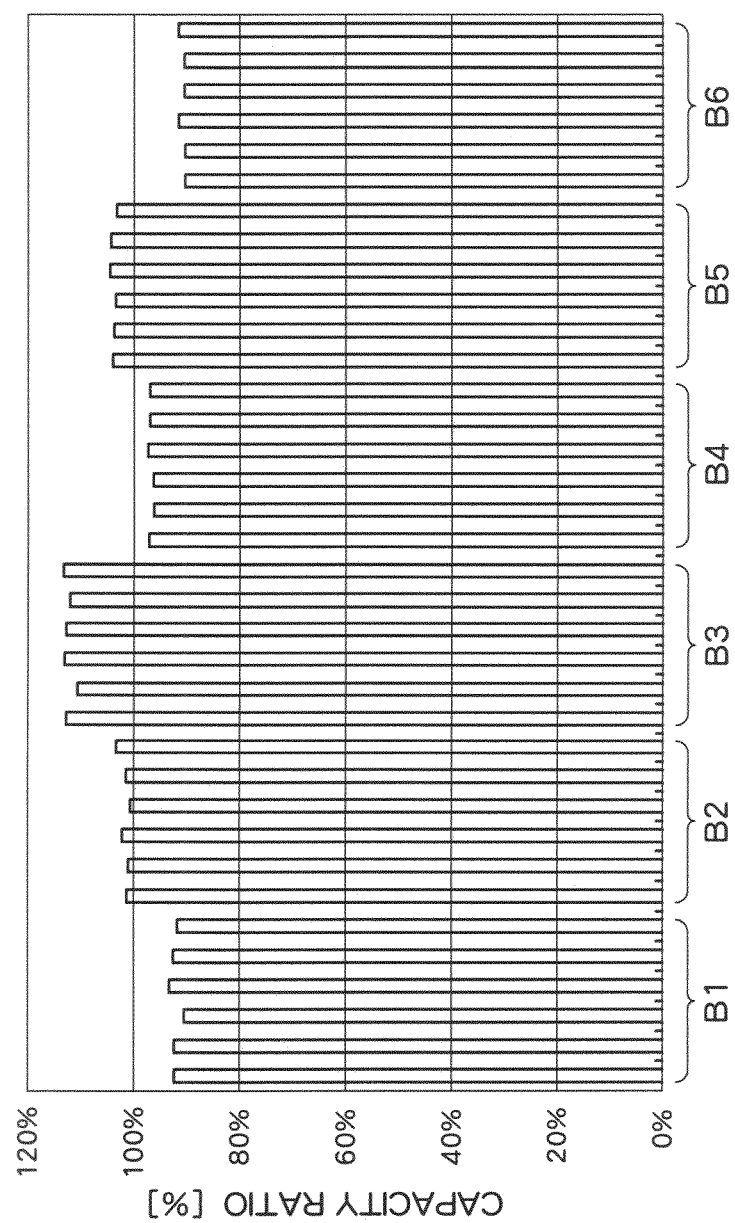
FIG. 3 is a graph showing an SOC (a relative ratio) of each of blocks.

FIG. 3 shows a distribution of states of charge (SOC) of the respective blocks B1 to B6 achieved after the vehicle equipped with the battery pack 10 has traveled over a given distance. A horizontal axis shows the battery cells B11 to B66 provided in the respective blocks B1 to B6, and a vertical axis shows a relative ratio of state of charge (a capacity ratio) acquired when an average of SOC values of all the blocks is taken as 100. The capacity ratios exhibit relationships of B3>B2, B4, B5>B1, B6, and a difference is understood to exist in the state of charge (SOC) among the blocks B1 to B6. When a difference arises on a per-block basis, a range of an SOC available for discharging or charging of the battery pack 10 is determined from the maximum SOC and the minimum SOC of an individual battery cell in order to prevent occurrence of overcharge or overdischarge of the individual battery cell. Charge and discharge characteristics of the battery pack are therefore limited. As a consequence, utilization efficiency of the battery pack is deteriorated. Such a difference in state of charge (SOC) is also caused by a difference of a battery cell itself (i.e., an individual difference of a battery cell). However, the difference in state of charge is further ascribable to a difference among the slave units M1 to M6 provided for the respective blocks in terms of a consumed current value, such as those mentioned above. Calculation of an SOC of each battery cell will be described later.

Descriptions provided so far are that, when the ignition is turned off, each of the slave units M1 to M6 selectively activates the discharge circuit M1a to compel blocks of interest to discharge electricity, thereby equalizing the states of charge (SOC). However, the greatest characteristic of the present embodiment lies in performance of equalization processing rather than in performance of forceful electric discharge when the ignition is turned off. Namely, on the assumption that a difference exists in the consumed current values of the respective slave units M1 to M6, the operation clock signals for the respective slave units M1 to M6 supplied when the ignition is turned on are controlled so as to perform equalization processing in order to lessen a difference in state of charge (SOC) among the respective blocks B1 to B6 induced by the difference among the consumed current values. Specifically, in the present embodiment, operation of the discharge circuit M1a is not indispensable. In this sense, a circuit configuration can be simplified by deleting the discharge circuit M1a. As a matter of course, it may also be possible to leave the discharge circuit M1a and to activate the discharge circuit M1a as necessary when the ignition is turned off, to thus compel blocks of interest to discharge electricity.

Figure 4:
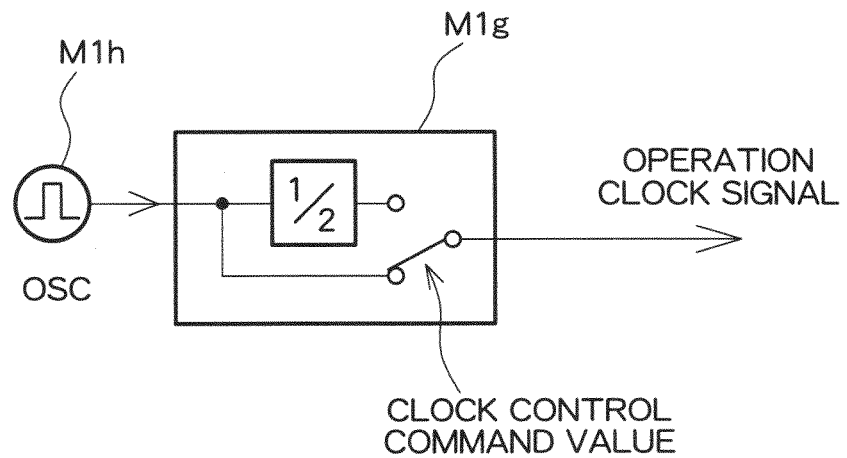
FIG. 4 is a block diagram of a clock controller.

Equalization processing performed when the ignition is turned on is hereunder described. FIG. 4 shows a block diagram of the clock controller M1g shown in FIG. 2. The clock controller M1g is built from a divide-by-two (denoted by ½ in the drawings) frequency divider and a switching circuit. The clock signal from the oscillator M1h is divided into two signals; one is supplied to a frequency divider where the signal is divided by two and further supplied to one contact point of the switching circuit, and the other is supplied in its unmodified form (without undergoing frequency division) to the other contact point of the switching circuit. The switching circuit switches between the contact points in accordance with a clock control command value (0 or 1) supplied from the master unit 26 to the respective slave units and outputs, as an operation clock signal, the free-of-frequency-division clock signal (a high frequency signal) or the divided-by-two clock signal (a low frequency signal). When the oscillator M1h is assumed to have output; for instance, a 500 kHz operation clock signal, the 500 kHz operation clock signal or a 250 kHz operation clock signal, which is generated as a result of the 500 kHz clock signal having been divided by two, is selectively output by means of switching operation of the switching circuit. The consumed current value of the slave unit M1 varies according to whether the operation clock signal is 500 kHz or 250 kHz.

Figure 5:
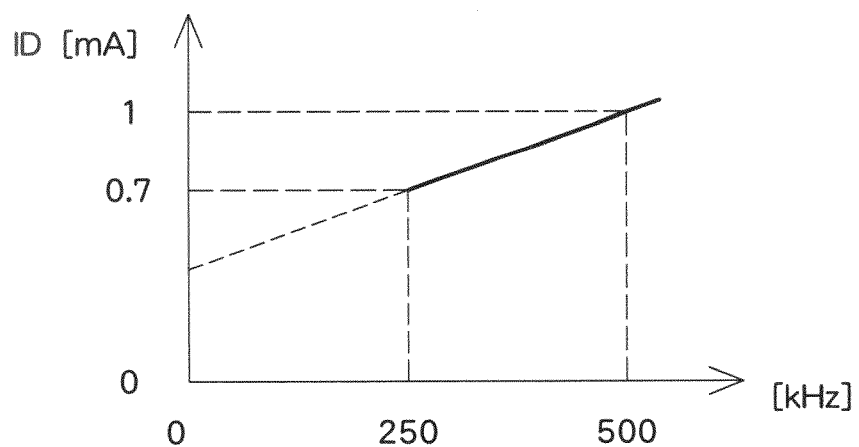
FIG. 5 is a graph showing a relationship between a frequency and current consumption.

FIG. 5 shows a relationship between a frequency of the operation clock signal and a consumed current value. In the drawing, a horizontal axis represents a frequency (kHz) of the operation clock signal, and a vertical axis represents a consumed current ID (mA). The frequency of the operation clock signal and a consumed current value are substantially proportional to each other; namely, the consumed current value proportionally increases as a frequency increases. When the frequency of the operation clock signal is 500 kHz, the consumed current value comes to 1 mA. When the frequency of the operation clock signal is 250 kHz, the consumed current value comes to 0.7 mA. In the embodiment, a difference in state of charge among the blocks B1 to B6 is lessened by utilization of such a relationship existing between the frequency and the consumed current value. Specifically, in relation to a block assuming a high state of charge, the operation clock signal is switched to the high frequency (500 kHz) in order to increase a consumed current value of a slave unit that manages the block and, by extension, to lessen the state of charge of the block. Meanwhile, in relation to a block assuming a low state of charge, the operation clock signal is switched to a low frequency (250 kHz) in order to lessen a consumed current value of a slave unit that manages the block and, by extension, to prevent occurrence of a reduction in state of charge. A ratio (an appearance ratio) of the high frequency (500 kHz) to the low frequency (250 kHz) and the combination of the high frequency with the low frequency are variously set, thereby controlling the degree of reduction in state of charge, so that the difference in state of charge among the blocks can thereby be lessened.

Figure 6:
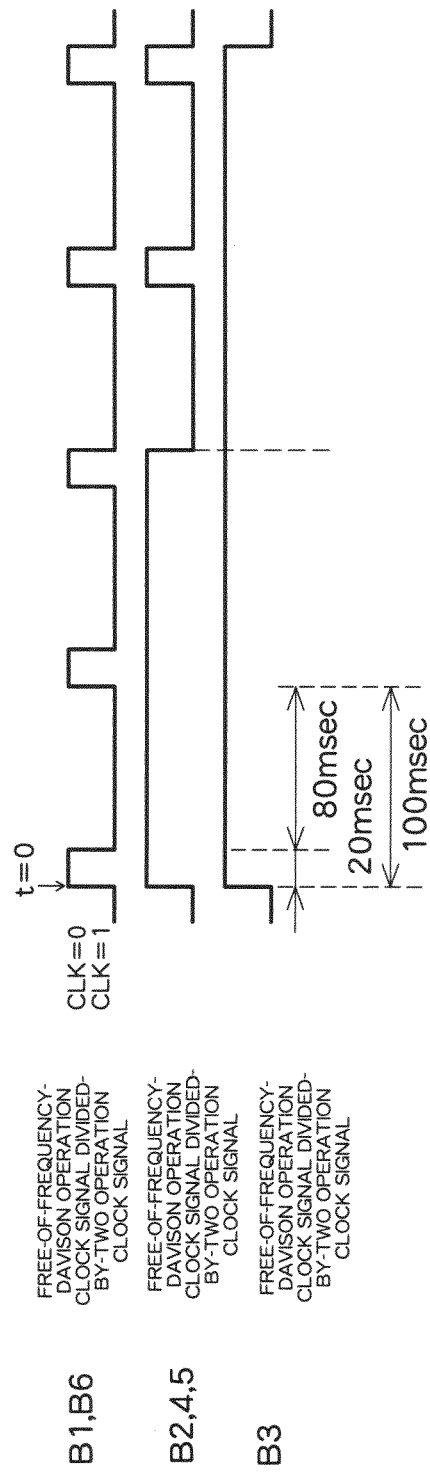
FIG. 6 is a timing chart of the first embodiment.

FIG. 6 shows a timing chart of the operation clock signals for the respective slave units M1 to M6. Since the slave units M1 to M6 manage their corresponding blocks B1 to B6, the respective slave units M1 to M6 are specified, in the drawing, by numbers assigned to the respective blocks B1 to B6 that are under management by the respective slave units M1 to M6. According to the clock control command values received from the master unit 26, the respective slave units M1 to M6 select operation of the switching circuits, thereby switching between the operation clock signals. The clock control command value is assumed to be represented by means of one bit data; namely, 0 or 1. Numeral 0 is assumed to denote free of frequency division, and numeral 1 is assumed to denote division by two. At reference timing; namely, a control time t=0, the master unit 26 outputs a single clock control command value of 0 to the respective slave units M1 to M6. Upon receipt of the clock control command value of 0, the respective slave units M1 to M6 sets the operation clock signals to free of frequency division; namely, 500 kHz. After elapse of 20 msec since control was started, the master unit 26 outputs clock control command values appropriate for differences in state of charge among the blocks B1 to B6, and the respective slave units M1 to M6 receive corresponding clock control command values. A clock control command value of one is output to the blocks B1 and B6; in other words, the slave units M1 and M6. Upon receipt of the clock control command value of one from the master unit 26, the slave units M1 and M6 switch the operation clock signal to division by two; namely, 250 kHz. Further, a clock control command value of 0 is output to the blocks B2, B4, and B5, and the slave units M2, M4, and M5 receive the clock control command value of 0 from the master unit 26, whereby the operation clock signal is maintained at 500 kHz without modifications. The clock control command value of 0 is output to the block B3. Upon receipt of the clock control command value of 0 from the master unit 26, the slave unit M3 holds the operation clock signal at 500 kHz without modifications. After additional elapse of 80 msec (i.e., after elapse of 100 msec since control was started), the above-mentioned operations are iterated. Thus, 100 msec is taken as a control period, and the operation clock signal is always set to 500 kHz during a first 20 msec period. The reason for this is that the analog-to-digital converter (ADC) M1c requiring high speed operation performs signal processing, such as analog-to-digital conversion, during the period. A remaining 80 msec period is an equalization processing period for reducing a difference in state of charge.

When a certain control period is reached as a result of repeated performance of foregoing processing, the master unit 26 outputs a clock control command value of 1 to the blocks B2, B4, and B5 after a 20 msec high speed operation period. Upon receipt of the clock control command value of 1 from the master unit 26, the slave units M2, M4, and M5 switch the operation clock signal to 250 kHz. Further, when a certain control period is reached as a result of further gaining of a time, the master unit 26 outputs a clock control command value of 1 to the block B3 after the 20 msec high speed operation period. Upon receipt of the clock control command value of 1 from the master unit 26, the slave unit M3 switches the operation clock signal to 250 kHz. As a result, the period during which a block operates at 500 kHz becomes longer in sequence of B3>B2, B4, B5>B1, and B6. Further, current consumption also increases in the same sequence, and hence the block B3 assuming a high state of charge undergoes a relatively large amount of reduction in state of charge. Conversely, the blocks B1 and B6 assuming a low state of charge are subjected to a relatively small amount of reduction in state of charge, with the result that the difference in state of charge is lessened. Average current consumption achieved when the blocks operate at 500 kHz over the entire 100 msec period is 1 mA. When the blocks operate at 500 kHz only for the 20 msec period, the average current consumption comes to 0.76 mA. Therefore, equalization processing is said to be performed by use of 0.24 mA that is a difference between the average consumed current values.

Figure 7:
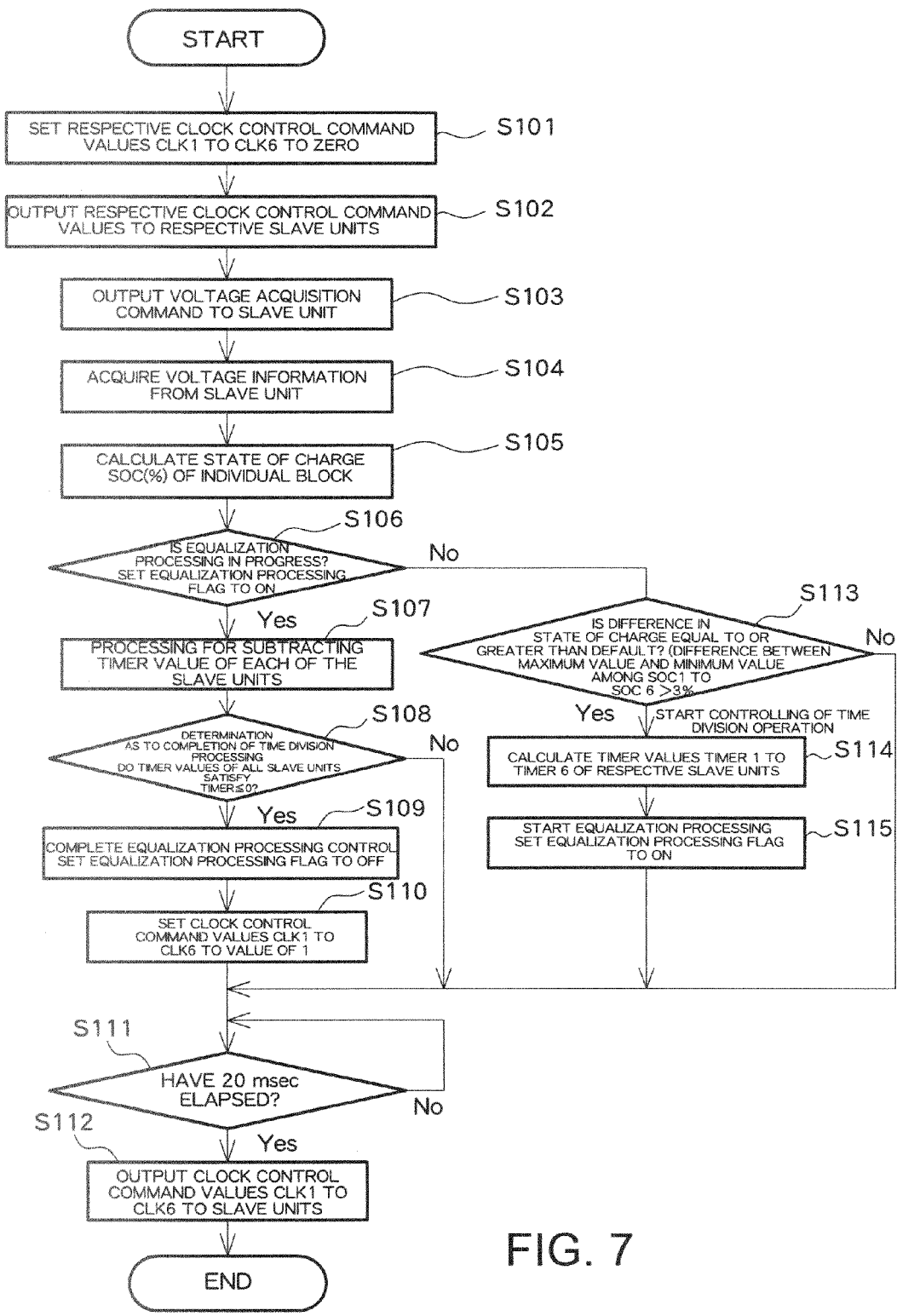
FIG. 7 is a processing flowchart of a master unit of the first embodiment.

FIG. 7 shows a processing flowchart of the master unit 26 of the present embodiment. The control period is 100 msec. First, the master unit 26 sets the respective clock control command values CLK1 to CLK6 to 0 (S101). In the following descriptions, the clock control command value for the slave unit M1 is CLK1; the clock control command value for the slave unit M12 is CLK2; and the same also applies to subsequent slave units. The clock control command value for the slave unit M6 is CLK6. The master unit 26 outputs the respective clock control command values CLK1 to CLK6 to the respective slave units M1 to M6 (S102).

Next, the master unit 26 outputs a voltage acquisition command to each of the slave units M1 to M6 (S103). In response to the command, the respective slave units M1 to M6 acquire voltages of the blocks that are under management of the respective slave units M1 to M6 and output the thus-acquired voltages to the master unit 26. The master unit 26 acquires voltage information from each of the slave units M1 to M6 (S104). The states of charge (SOC) of the individual blocks are calculated from the thus-acquired voltage information (S105). A specific calculation method will be described later.

After calculation of the states of charge (SOC) of the individual blocks, the master unit 26 determines whether or not equalization processing is in progress (S106). An equalization processing flag is set to an OFF position (where equalization processing is not performed) at startup. The flag stays in the OFF position unless equalization processing is initiated. According to whether the equalization processing flag is in an ON position or the OFF position, the master unit 26 determines whether or not equalization processing is in progress. As a result of use of the equalization processing flag, a determination can be made as to whether or not equalization processing is in progress, regardless of an SOC value. Further, it is desirable that, even when the ignition of a vehicle equipped with the battery pack is turned off, the value of the flag is maintained.

When equalization processing is not in progress, the master unit 26 then determines whether or not the difference in state of charge (SOC) is equal to or greater than a default value (S113). For instance, when a difference between the maximum value and the minimum value, among the states of charge SOC 1 to SOC 6 of the respective blocks B1 to B6, exceeds 3%, the difference is determined to be greater than the default value. When the difference is equal to or less than the default value, equalization processing does not need to be performed. On the contrary, when the difference is greater than the default value, the master unit 26 calculates timer values Timer 1 to Timer 6 that are equalization processing periods in connection with the respective slave units M1 to M6 (S114). Specific calculation of the timer values is also described later. Equalization processing is then initiated, and the equalization processing flag is set to the ON position (S115). Next, the master unit 26 determines whether or not 20 msec has elapsed (S111). At a point in time when 20 msec has elapsed, the clock control command values CLK1 to CLK6 are output to the respective slave units M1 to M6 (S112).

In the meantime, when equalization processing is already in progress, the master unit 26 performs processing for subtracting the timer values of the respective slave units M1 to M6 (S107). The processing is also described later. It is then determined whether or not the timer values of all of the slave units M1 to M6 have come to 0 (S108). When the timer values have come to 0, the equalization processing flag is set to the OFF position on the assumption that equalization processing (time division processing) is completed (S109), and the respective clock control command values CLK1 to CLK6 are set to a value of 1 (S110). Subsequently, it is determined whether or not 20 msec has elapsed. The clock control command values CLK1 to CLK6 are output to the respective slave units M1 to M6 after elapse of 20 msec (S111 and S112).

Figure 8:
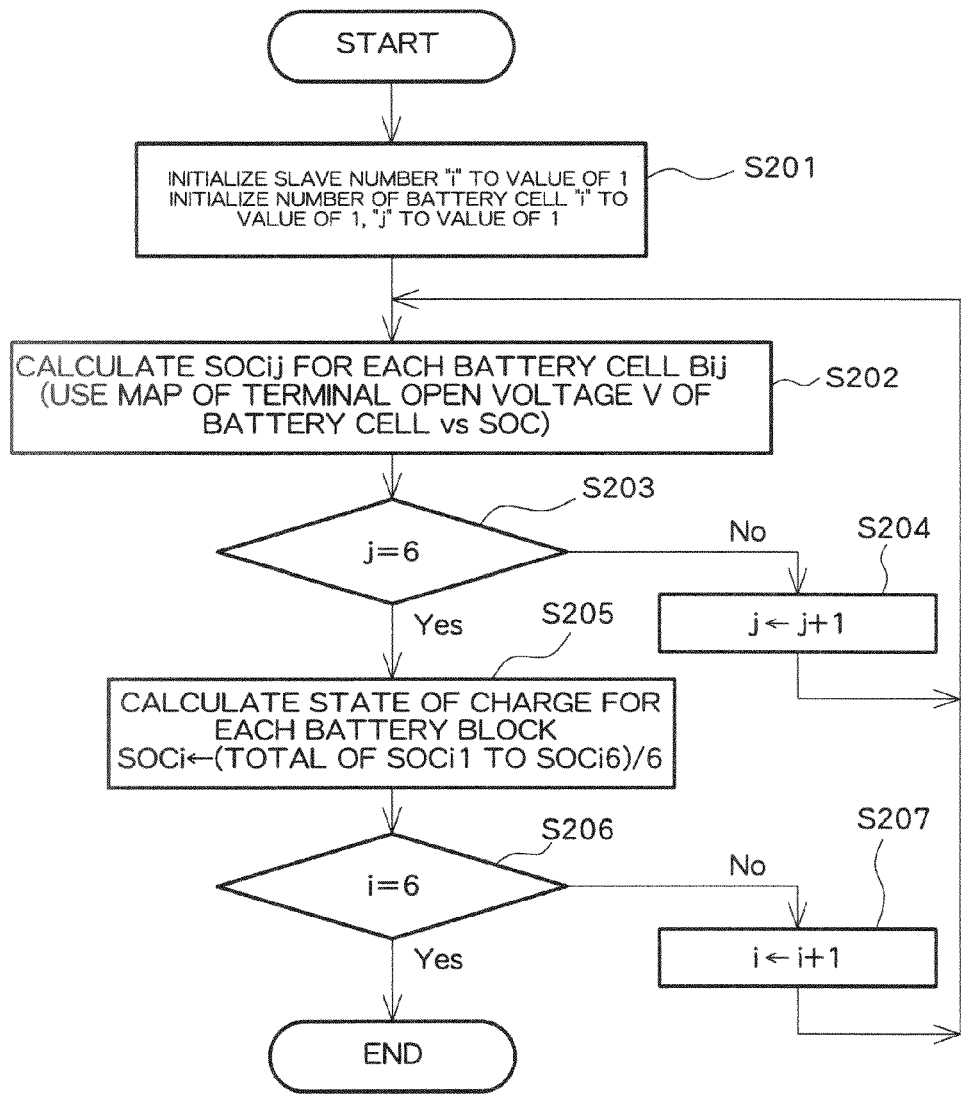
FIG. 8 is a flowchart of processing for calculating a state of charge (remaining capacity) pertaining to FIG. 7.

FIG. 8 shows processing pertaining to S105; namely, processing for calculating the states of charge (SOC) of the respective blocks. The master unit 26 first initializes number "i" of the slave unit Mi to a value of 1 and also initializes number Bij (i=1, j=1) of an individual battery cell (cell) in the block (S201).

Next, an SOCij of the individual battery cell Bij is calculated by use of a map defining a predetermined relationship between a terminal voltage and an SOC of a battery cell (S202). The map is stored in memory of the master unit 26 in advance. The SOCij of the battery cell Bij denotes as a percentage (%) a ratio achieved when a fully charged state is taken as a value of 100 in relation to the state of charge. SOCij values of all of the battery cells in the block are calculated (S203 and S204), whereby the states of charge (SOC) of the individual battery blocks are calculated (S205). Calculation is for determining average SOC of all of the battery cells in the block, and the average SOC is taken as SOCi. The processing operations are performed for all of the blocks B1 to B6 (S206 and S207).

Figure 9:
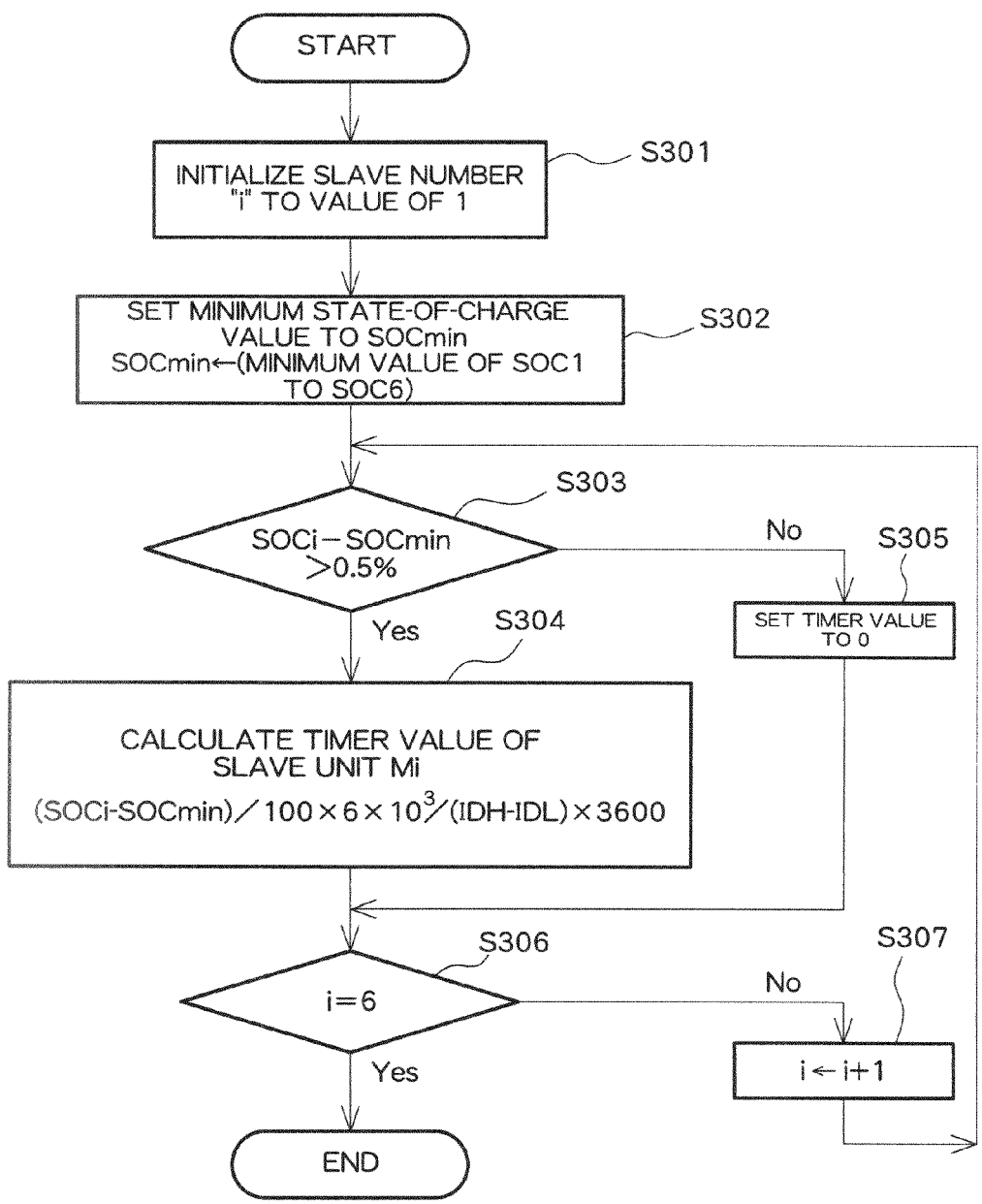
FIG. 9 is a flowchart of processing for calculating timer values shown in FIG. 7.

FIG. 9 shows processing pertaining to S114; namely, processing for calculating the timer values Timer 1 to Timer 6 of the respective slave units M1 to M6. First, number "i" of the slave unit Mi is initialized (S301). Next, the minimum state-of-charge (SOC) value is extracted and taken as SOCmin (S302). It is determined whether or not a difference between SOCi and SOCmin of the block Bi under management of the slave unit exceeds 0.5% (S303). When the difference does not exceed 0.5%; namely, when the difference is equal or substantially equal to the minimum value, the timer value is set to 0 (S305). On the other hand, when the difference exceeds 0.5%, the timer value is calculated according to the difference value (S304). Specifically, a timer value is calculated by $$\text{A timer value} = (SOC_i - SOC_{min})/100 \times 6 \times 10^3/(IDH - IDL) \times 3600.$$

Reference symbol IDH means a consumed current value by use of the free-of-frequency-division clock signal, and IDL means a consumed current value acquired by use of the divided-by-two clock signal. As mentioned previously, when IDH=1 mA and IDL=0.76 mA, IDH−IDL=0.24 mA is obtained. The reason why a value of six is included in multiplication is that fully charged capacity of the battery cell is set to 6 AH. The reason why a value of 3600 is included in multiplication is that a calculation result is converted into seconds. Foregoing processing is repeatedly performed in connection with all of the slave units (S306 and S307), thereby calculating the timer values Timer 1 to Timer 6.

Figure 10:
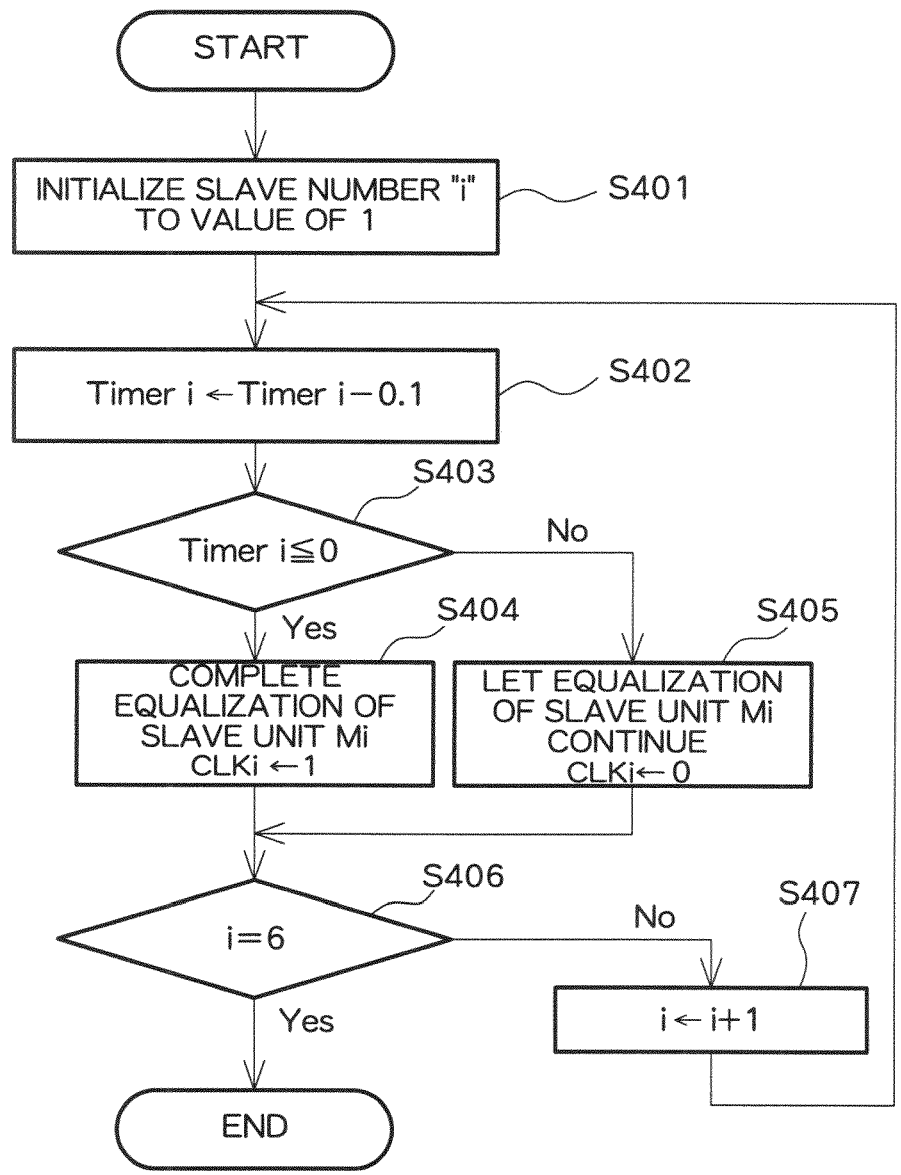
FIG. 10 is a flowchart of processing for subtracting the timer values shown in FIG. 7.

FIG. 10 shows processing pertaining to S107; namely, processing for subtracting the timer values of the respective slave units M1 to M6. First, number "i" of the slave unit is initialized to one (S401). Next, a value of Timeri is subtracted by 0.1 (second) that is equivalent to the control period of the master unit 26 (S402). It is determined whether or not Timeri is 0 or less (S403). When Timeri is 0 or less, the clock control command value CLKi is set to a value of 1 on the assumption that equalization processing of the slave unit Mi is completed (S404). Meanwhile, when Timeri has not yet reached 0, the clock control command value CLKi is set to 0 in order to make equalization processing of the slave unit Mi continual (S405). Foregoing processing is repeatedly performed for all of the slave units (S406 and S407), whereby the clock control command values CLK1 to CLK6 of the respective slave units are set. The respective clock control command values CLK1 to CLK6 set as mentioned above are output to the respective slave units M1 to M6 after elapse of 20 msec as shown in FIG. 7. Thus, the operation clock signal is determined to operate at 500 kHz without modifications or at 250 kHZ generated by dividing the operation clock signal by two.

Figure 11:
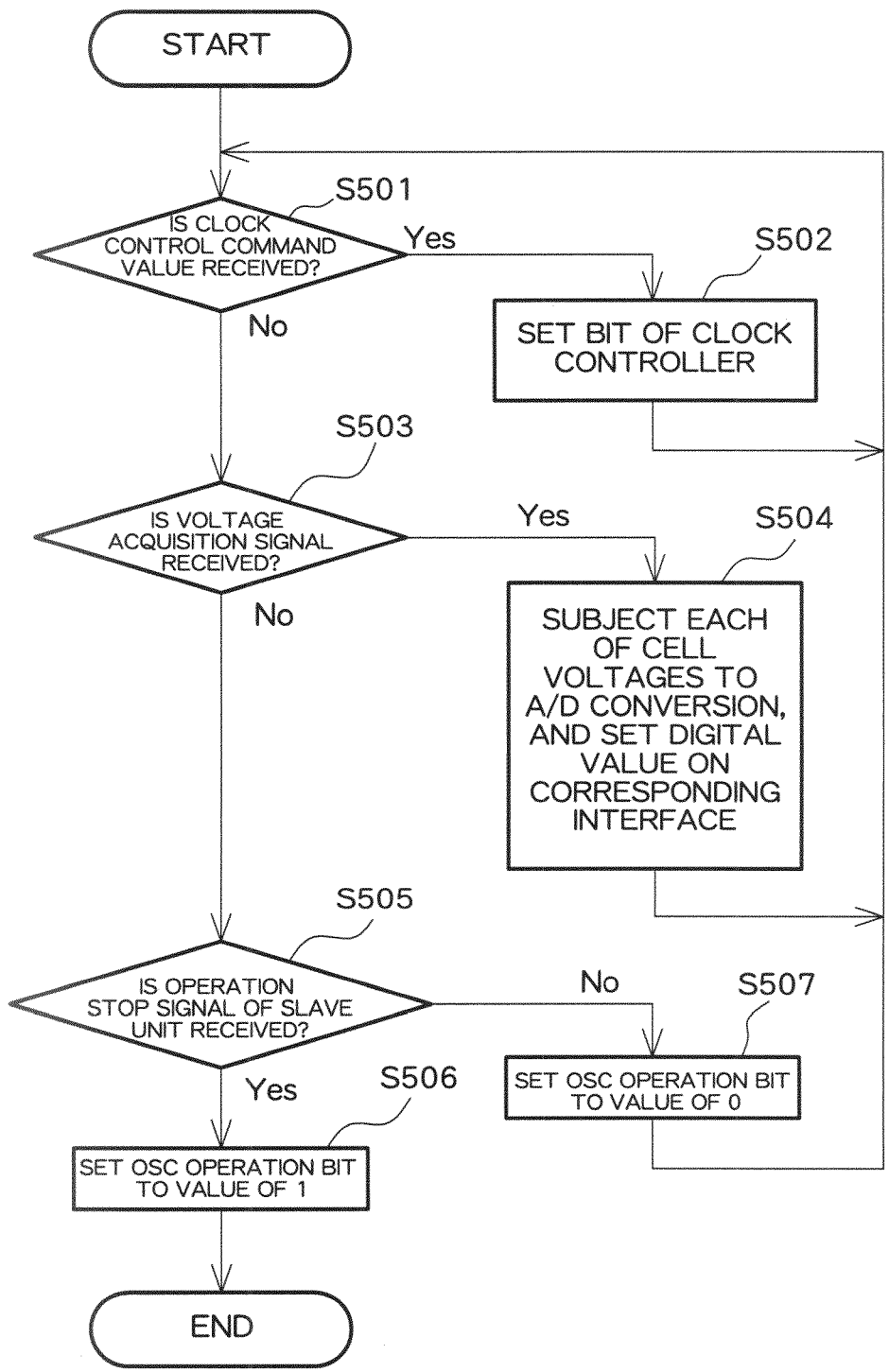
FIG. 11 is a processing flowchart of the slave units.

FIG. 11 is an operation flowchart of the respective slave units M1 to M6 that receive the respective clock control command values CLK1 to CLK6. First, it is determined whether or not the clock control command value CLK is received from the master unit 26 (S501). When the clock control command value is received, a bit for determining operation of the switching circuit of the clock controller is set according to the clock control command value CLK (S502). Setting a bit has the following meaning. In the case of; for instance, the slave unit M1, a contact point of the switching circuit in the clock controller M1g is switched according to the clock control command value CLK. When the clock control command value CLK is 0, the contact point is switched to a free of-frequency-division side. On the contrary, when the clock control command value CLK is 1, the contact point is switched to an output side of the frequency divider (see FIG. 4).

When the clock control command value CLK is not received, it is determined whether or not the voltage acquisition signal is received (S503). When the voltage acquisition signal is received, terminal voltages of the respective battery cells in the block under management by the slave unit are subjected to analog-to-digital conversion, and resultantly-acquired digital values are set in the corresponding interface (S504). For instance, in the case of the slave unit M1, the terminal voltages are converted into digital values by the ADC M1c, and the digital values are set in the interface M1i.

When the voltage acquisition signal is not received, it is then determined whether or not an operation stop signal is received (S505). When the ignition of the vehicle equipped with the battery pack manager is turned OFF, or in a like case, the master unit 26 transmits an operation stop signal to each of the slave units M1 to M6. An operation bit of the oscillator keeps holding a value of 0; namely, stays in an operating state, unless otherwise the operation stop signal is received (S506). However, when the operation stop signal is received, the operation bit of the oscillator is set to a value of 1; namely, a stop position (S507).

When the master unit 26 and the respective slave units M1 to M6 are connected to each other in the form of a daisy chain connection, a signal is transmitted in sequence of the master unit 26, the slave unit M1, the slave unit M2, . . . , the slave unit M6, and the master unit 26. Timing at which the master unit 26 outputs a signal is substantially identical with timing at which the respective slave units M1 to M6 and the master unit 26 receive the signal. Moreover, in order to recover the digital values set in the interface for the respective slave units M1 to M6, the master unit 26 is configured so as to recover a value of RAM in the interface, so long as the voltage acquisition command is output to a communication path. Although the descriptions are given to division by two in connection with a degree of frequency division, the degree of frequency division can arbitrarily be set, like division by three or division by four, according to a difference in state of charge. As mentioned, in the present embodiment, equalization processing is performed for a timer period commensurate with the difference by use of the high frequency operation clock signal and the low frequency operation clock signal, whereby the difference in state of charge among the blocks can be lessened.

Second Embodiment

FIG. 12 and FIG. 13 show timing charts for a second embodiment. In the present embodiment, current consumption IDinit of each of the slave units M1 to M6 is measured and stored in memory of the master unit 26 before shipment of a battery pack. The master unit 26 lets a slave unit that would involve relatively larger current consumption IDinit operate by means of a pattern that would make a consumed current value relatively smaller. For instance, a difference in state of charge is lessened by letting the slave unit operate in iterated cycles by use of various patterns that are combinations of a free-of-frequency-division operation clock signal (a high frequency signal) with a divided-by-two operation clock signal (a low frequency signal) at an arbitrary ratio (appearance ratio).

FIG. 12 shows operation timing charts of a certain slave unit. The operation clock signals include two frequencies; namely, one frequency that is free of frequency division and another frequency that involves division by two. As in the first embodiment, a first 20 msec period of the 100 msec control period is taken as a clock control command value (a consumed current value IDH) always showing a free-of-frequency-division operation clock signal. The remaining 80 msec period is taken as either a clock control command value showing the free-of-frequency-division operation clock signal (the consumed current value IDH) or a clock control command value showing the divided-by-two operation clock signal (the consumed current value IDL). The operation clock signal is hereinafter taken simply as a free-of-frequency-division operation clock signal (IDH) or the divided-by-two operation clock signal (IDL). FIG. 12 shows four patterns (a) to (d) appearing during a 400 msec period consisting of four consecutive control periods in which 100 msec is a unit of control period. The pattern (a) shows that the divided-by-two operation clock signal (IDL) always appears after elapse of 20 msec. The pattern (b) shows that the free-of-frequency-division operation clock signal (IDH) appears after elapse of 20 msec in the first control period and that the divided-by-two operation clock signal (IDL) appears in the remaining control periods. The pattern (c) shows that the free-of-frequency-division operation clock signal (IDH) appears after elapse of 20 msec in two control periods; i.e., the first control period and the second control period, and that the divided-by-two operation clock signal (IDL) appears in the remaining control periods. The pattern (d) shows that the free-of-frequency-division operation clock signal (IDH) always appears after elapse of 20 msec. The minimum consumed current value is obtained in the pattern (a), and the largest consumed current value is obtained in the pattern (d).

FIG. 13 schematically shows the timing chart of FIG. 12. Attention is paid to the remaining 80 msec period subsequent to the 20 msec period in the 100 msec control period. Four 80 msec periods are taken, along a time axis, as q=1, q=2, q=3, and q=4 in sequence of elapse of time. Operation clock signals IDH and IDL in the respective periods are listed in the chart. As mentioned previously, the minimum current consumption is achieved in the pattern (a), and current consumption becomes greater in sequence of the pattern (b), the pattern (c), and the pattern (d). Therefore, a slave unit involving great current consumption, among the slave units M1 to M6, is operated by use of the pattern (a). Further, a slave unit involving small current consumption is operated by use of any one of the patterns (b) to (d) according to the degree of current consumption, whereby a difference in state of charge can be lessened.

Figure 14:
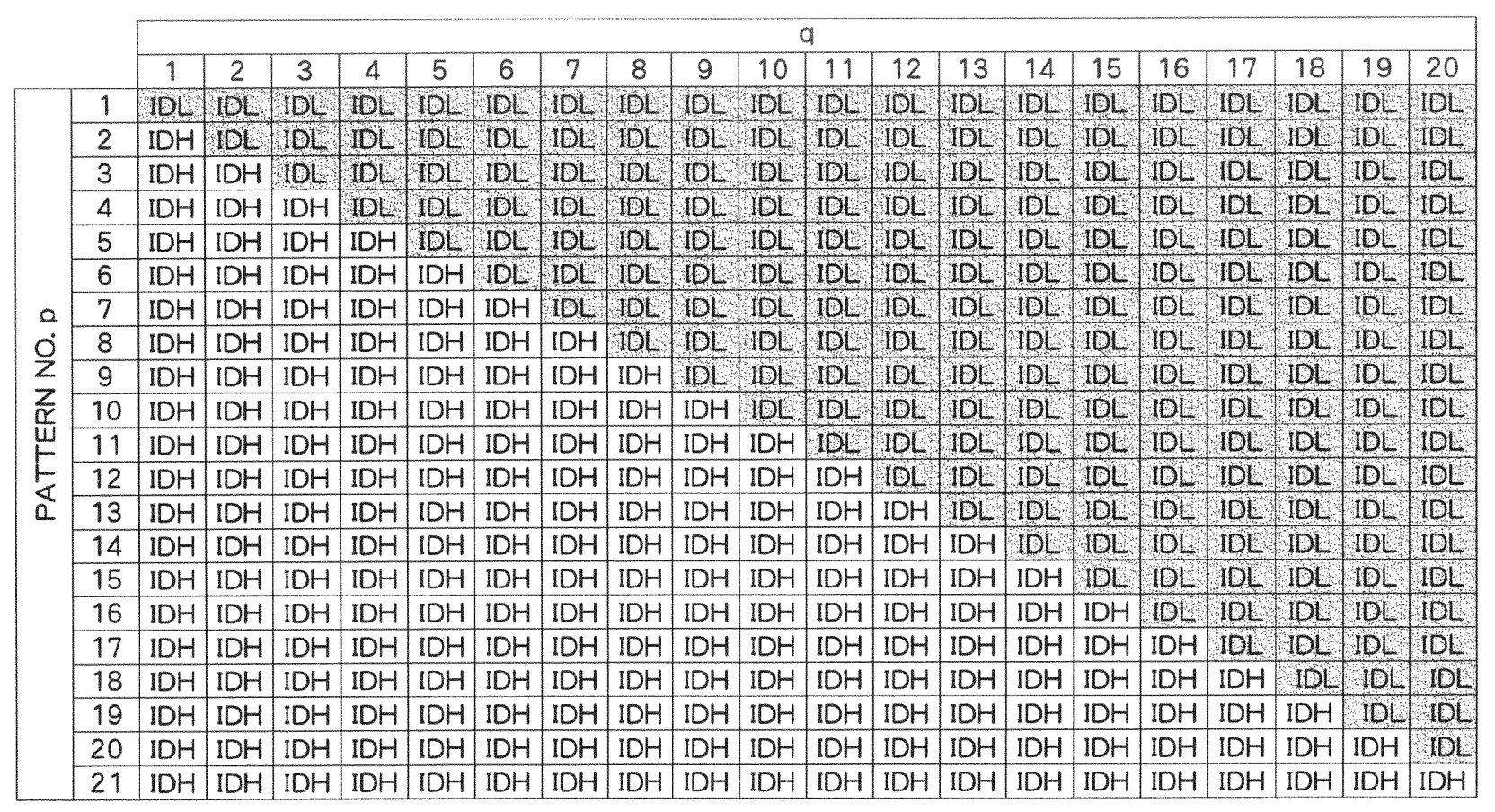

FIG. 14 shows patterns that provide possible combinations of the operation clock signals IDH and IDL in 20 control periods from q=1 to q=20; namely, in a 2000 msec period. There are unique 21 patterns, and the ratio of the operation clock signal IDH increases as a pattern number "p" increases. When any one of the patterns is selected, operation is iterated according to the selected single pattern while the 2000 msec period of that pattern is taken as one cycle. A pattern assigned pattern number p=1 is one in which the operation clock signal IDL appears in all of the control periods q=1 to q=20. A pattern assigned pattern number p=21 is one in which the operation control signal IDH appears in all of the control periods q=1 to q=20. A pattern assigned pattern number p=11 is one in which the operation clock signal IDH appears in the control periods q=1 to q=10 and in which the operation clock signal IDL appears in the control periods q=11 to q=20. The operation clock signals IDH and IDL in each of the slave units M1 to M6 are measured and stored in the memory of the master unit 26 before shipment. It is therefore possible to readily calculate current consumption which will be achieved as a result of each of the slave units operating according to the respective patterns by use of measurement data.

It is now presumed that IDinitH and IDinitL, which belong to current consumption IDinit achieved before shipment of the individual slave units M1 to M6, would assume the following values (this presumption is for calculation purpose, and it should be noted that the presumption be irrelevant to current consumption which induces a difference in state of charge shown in FIG. 3).

Slave Unit M1:
IDinitH=0.90 mA, and IDinitL=0.60 mA
Slave Unit M2:
IDinitH=0.94 mA, and IDinitL=0.65 mA
Slave Unit M3:
IDinitH=1.0 mA, and IDinitL=0.70 mA
Slave Unit M4:
IDinitH=1.05 mA, and IDinitL=0.75 mA Slave Unit M5:
IDinitH=1.08 mA, and IDinitL=0.78 mA
Slave Unit M6:
IDinitH=1.1 mA, and IDinitL=0.8 mA Specifically, the slave unit M1 involves the minimum current consumption, and the slave unit M6 involves the maximum current consumption.

FIG. 15 shows consumed current values i acquired when the individual slave units M1 to M6 are operated according to the respective pattern maps shown in FIG. 14. For instance, when the slave units are operated according to the pattern assigned pattern number p=1, the slave unit M1 exhibits consumed current value IDp=0.66 mA; the slave unit M2 exhibits consumed current value IDp=0.708 mA; the slave unit M3 exhibits consumed current value IDp=0.76 mA; the slave unit M4 exhibits consumed current value IDp=0.81 mA; the slave unit M5 exhibits consumed current value IDp=0.84 mA; and the slave unit M6 exhibits consumed current value IDp=0.86 mA. Likewise, when the slave units are operated according to the pattern assigned pattern number p=21, the slave unit M1 exhibits consumed current value IDp=0.90 mA; the slave unit M2 exhibits consumed current value IDp=0.94 mA; the slave unit M3 exhibits consumed current value IDp=1.00 mA; the slave unit M4 exhibits consumed current value IDp=1.05 mA; the slave unit M5 exhibits consumed current value IDp=1.08 mA; and the slave unit M6 exhibits consumed current value IDp=1.10 mA.

The slave unit involving the maximum current consumption is the slave unit M6. Accordingly, the pattern involving occurrence of the minimum current consumption or the pattern involving occurrence of relatively-smaller current consumption is allocated to the slave unit M6. For instance, the pattern assigned pattern number p=3 is allocated to the slave unit M6. An average consumed current value IDp of the slave unit M6 acquired as a result of allocation of that pattern assumes a value of 0.884 mA. Patterns for the other slave units are selected such that a difference between the average consumed current value IDp of the slave unit M6 and an average consumed current value of each of the other slave units becomes minimum. FIG. 15 also shows a difference between the average current consumption IDp acquired as a result of the slave unit M6 having been operated according to the pattern assigned the pattern number p=3 and average current consumption of each of the slave units M1 to M6. For instance, when the pattern assigned pattern number p=1 is allocated to the slave unit M1, a difference in current consumption between the slave unit M1 and the slave unit M6 is 0.224 mA. When the pattern assigned patter number p=20 is allocated to the slave unit M1, a difference in current consumption between the slave unit M1 and the slave unit M6 assumes the minimum value of −0.004 mA. Therefore, the pattern assigned pattern number p=20 is selected for the slave unit M1. Likewise, when the pattern assigned pattern number p=16 is allocated to the slave unit M2, a difference in current consumption between the slave unit M2 and the slave unit M6 assumes a minimum value of 0.002 mA. Therefor, the pattern assigned pattern number p=16 is selected for the slave unit M2. When the pattern assigned pattern number p=11 is allocated to the slave unit M3, a difference in current consumption between the slave unit M3 and the slave unit M6 assumes a minimum value of 0.004 mA. Therefor, the pattern assigned pattern number p=11 is selected for the slave unit M3.

FIG. 16 shows pattern number "p" selected for each of the slave units M1 to M6 as mentioned above and an average consumed current value IDp of each of the slave units M1 to M6 acquired when the corresponding pattern is selected. As is seen from FIG. 15, when all of the slave units M1 to M6 are operated according to the pattern assigned pattern number p=1, a difference of 0.2 mA arises among the slave units M1 to M6. As is understood from FIG. 16, only a difference of 0.008 mA has occurred after selection of the pattern; hence, the difference in state of charge (SOC) among the blocks B1 to B6 is lessened.

Figure 17:
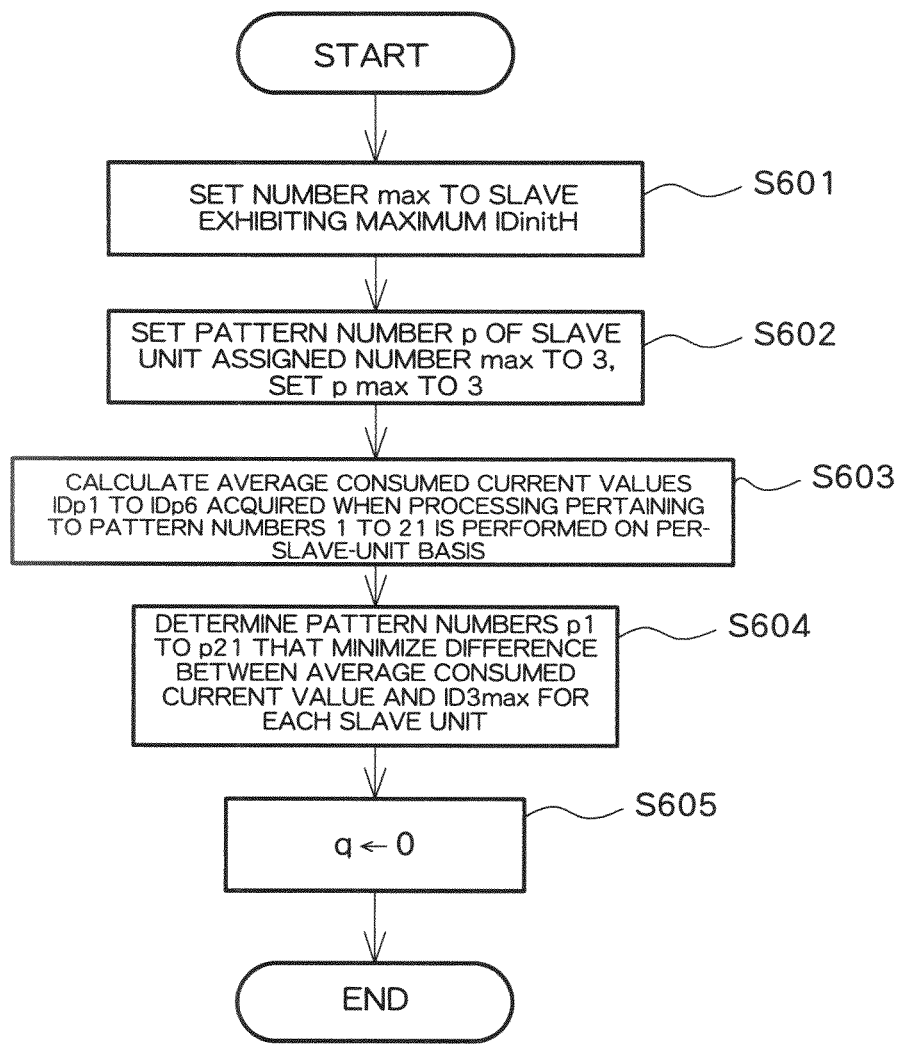
FIG. 17 is a flowchart of a master unit of the second embodiment employed when the master unit is started.

FIG. 17 shows a flowchart of the present embodiment employed at startup of the master unit 26. First, among the slave units M1 to M6, a slave unit having the maximum current consumption IDinitH measured before shipment is assigned a number max (S601). For instance, when the slave unit M6 is assumed to correspond to this slave unit, a variable max that specifies the slave unit M6 is taken as six. Next, a pattern number "p" is set to p=3 as a pattern involving a relatively smaller average consumed current value in relation to the slave unit of interest (e.g., the slave unit exhibited the maximum current consumption IDinitH before shipment; for instance, the slave unit M6) (S602). An average consumed current value acquired when the operation clock signal (IDH or IDL) is controlled by means of the respective patterns assigned pattern numbers p=1 to p=21 shown in FIG. 14; namely, a value equivalent to those shown in FIG. 15, is calculated, on a per-slave-unit basis, (S603). An average consumed current value of the slave unit M1 acquired at this time is taken as IDp1; an average consumed current value of the slave unit M2 is taken as IDp2; and subsequently an average consumed current value of the slave unit M6 is likewise taken as IDp6. There is determined on a per-slave unit basis, among the patterns assigned pattern numbers p1 to p21, a pattern that minimizes a difference between the average consumed current value of each of the slave units and an average consumed current value (which is taken as ID3max) acquired when the slave unit M6 is operated according to the pattern assigned pattern number p=3 (S604). Finally, the number "q" of the control period is initialized to a value of 0 (S605). Although the pattern assigned pattern number p=3 is set for the slave unit exhibited the maximum consumed current value IDinitH before shipment in the embodiment, the pattern can also be changed to a pattern assigned pattern number p=2 or p=1.

Figure 18:
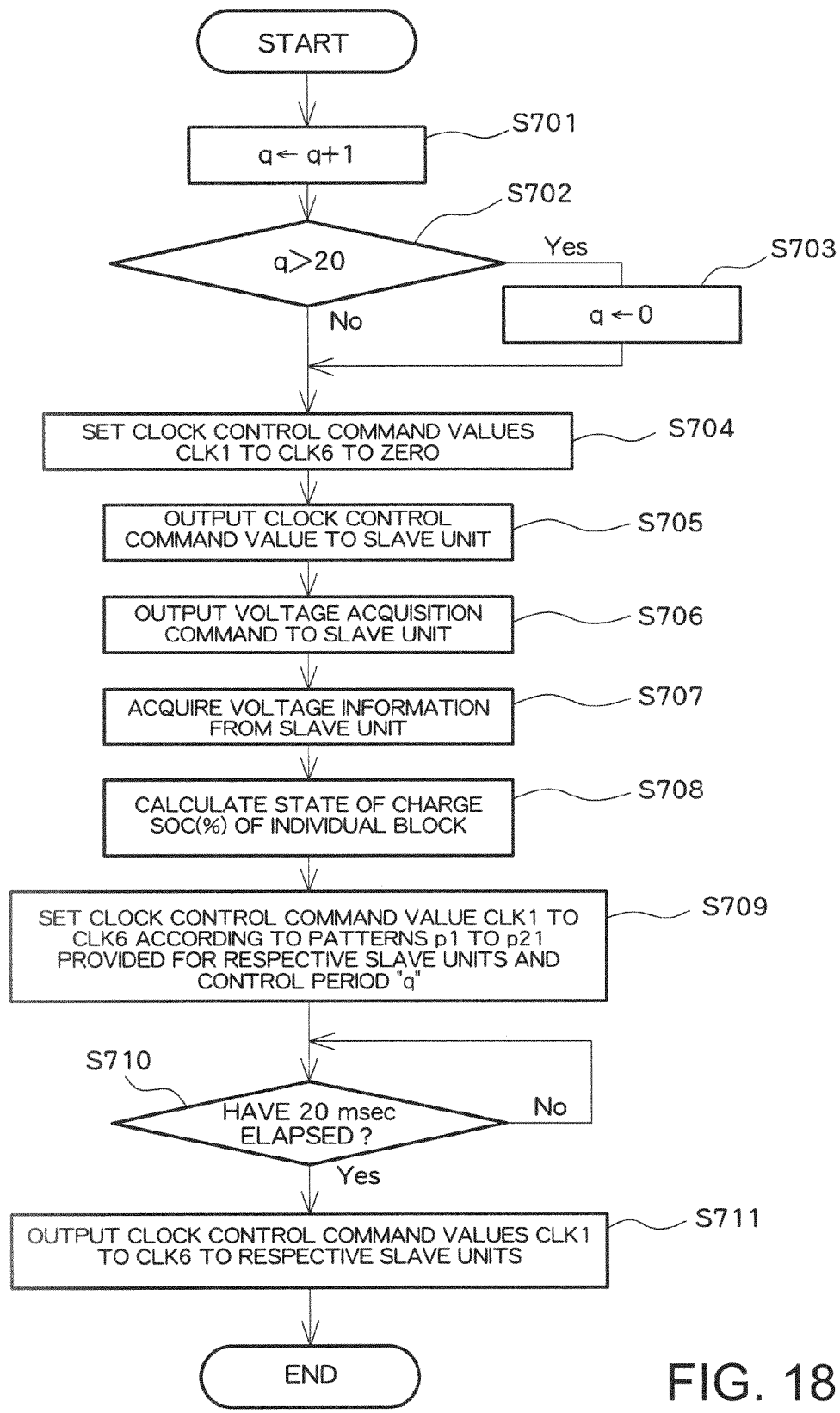
FIG. 18 is a processing flowchart of the master unit of the second embodiment.

FIG. 18 shows a processing flowchart of the master unit 26 of the embodiment. Processing is subsequent to startup processing shown in FIG. 17 after completion of the startup processing and is performed every 100 msec control period. First, the number "q" of the control period is incremented by one (S701), and a determination is made as to whether or not the number "q" has exceeded 20 (S702). When the number "q" has exceeded 20; namely, when 2000 msec=100 msec×20 has elapsed, the number "q" is determined to have completed a full circle (one cycle), and the number "q" is reset to 0 (S703).

The clock control command values CLK1 to CLK6 for the respective slave units M1 to M6 are set to 0; namely, the free-of-frequency-division operation clock signals (S704), and the clock control command values are output to the respective slave units M1 to M6 (S705). During the first 20 msec control period, all of the slave units M1 to M6 are thereby operated by means of the high frequency signals.

Next, the voltage acquisition command is output to each of the slave units M1 to M6 (S706), thereby acquiring voltage information from each of the slave units M1 to M6 (S707).

The master unit 26 then calculates states of charge (SOC) of the respective blocks B1 to B6 under management y the respective slave units M1 to M6 (S708). Calculation is performed by a method analogous to the calculation method shown in FIG. 8. After calculation of the states of charge (SOC) of the respective blocks B1 to B6, the respective clock control command values CLK1 to CLK6 are set according to the selected pattern numbers determined in S604 shown in FIG. 17 for each of the slave units M1 to M6 and the control period "q" (S709). For instance, since the slave unit M1 is allocated the selected pattern having pattern number "p"=20, the free-of-frequency-division operation clock signal (IDH) is provided during the control periods q=1 to q=19. Further, the divided-by-two operation clock signal (IDL) is provided during the control period q=20. Since the slave unit M2 is given the selected pattern assigned pattern number p=16, the free-of-frequency-division operation clock signal (IDH) is provided during the control periods q=1 to q=15, and the divided-by-two operation clock signal (IDL) is provided during the control periods q=16 to q=20.

After the respective clock control command values CLK1 to CLK6 of the respective slave units M1 to M6 have been determined as mentioned above, it is determined whether or not 20 msec have elapsed (S710). The respective clock control command values CLK1 to CLK6 determined in S709 are output to the respective slave units M1 to M6 at a point in time when 20 msec have elapsed (S711). The difference in state of charge (SOC) among the blocks B1 to B6 is thereby lessened. It should be noted that the clock control command values CLK1 to CLK6 determined in S709 are not determined on the basis of the difference in state of charge (SOC) among the blocks B1 to B6 calculated in S708 but on the basis of the difference in consumed current values (IDinitH or IDinitL) of a battery pack measured before shipment.

Figure 19:
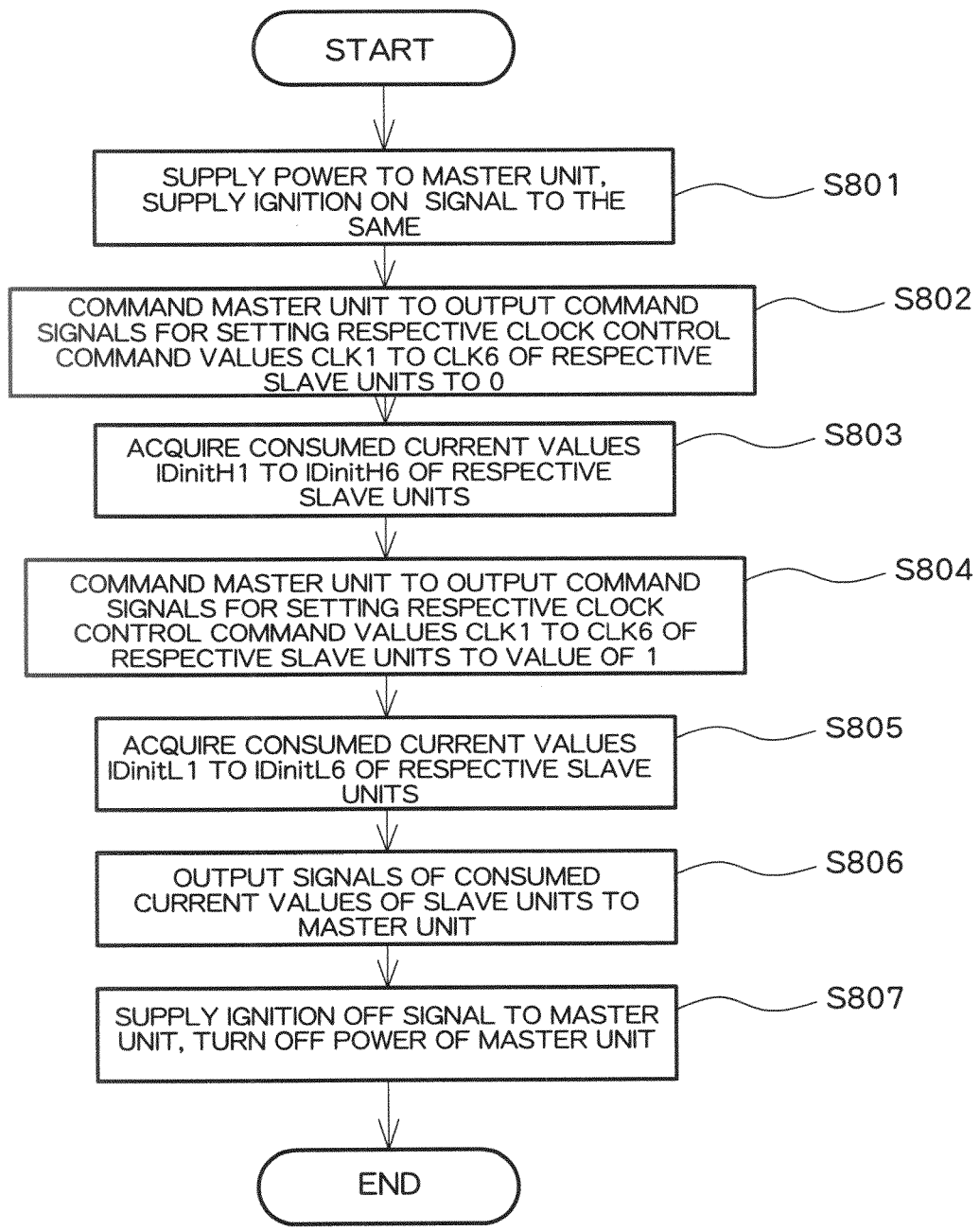
FIG. 19 is a flowchart of inspection equipment employed before shipment in the second embodiment.
Figure 23:
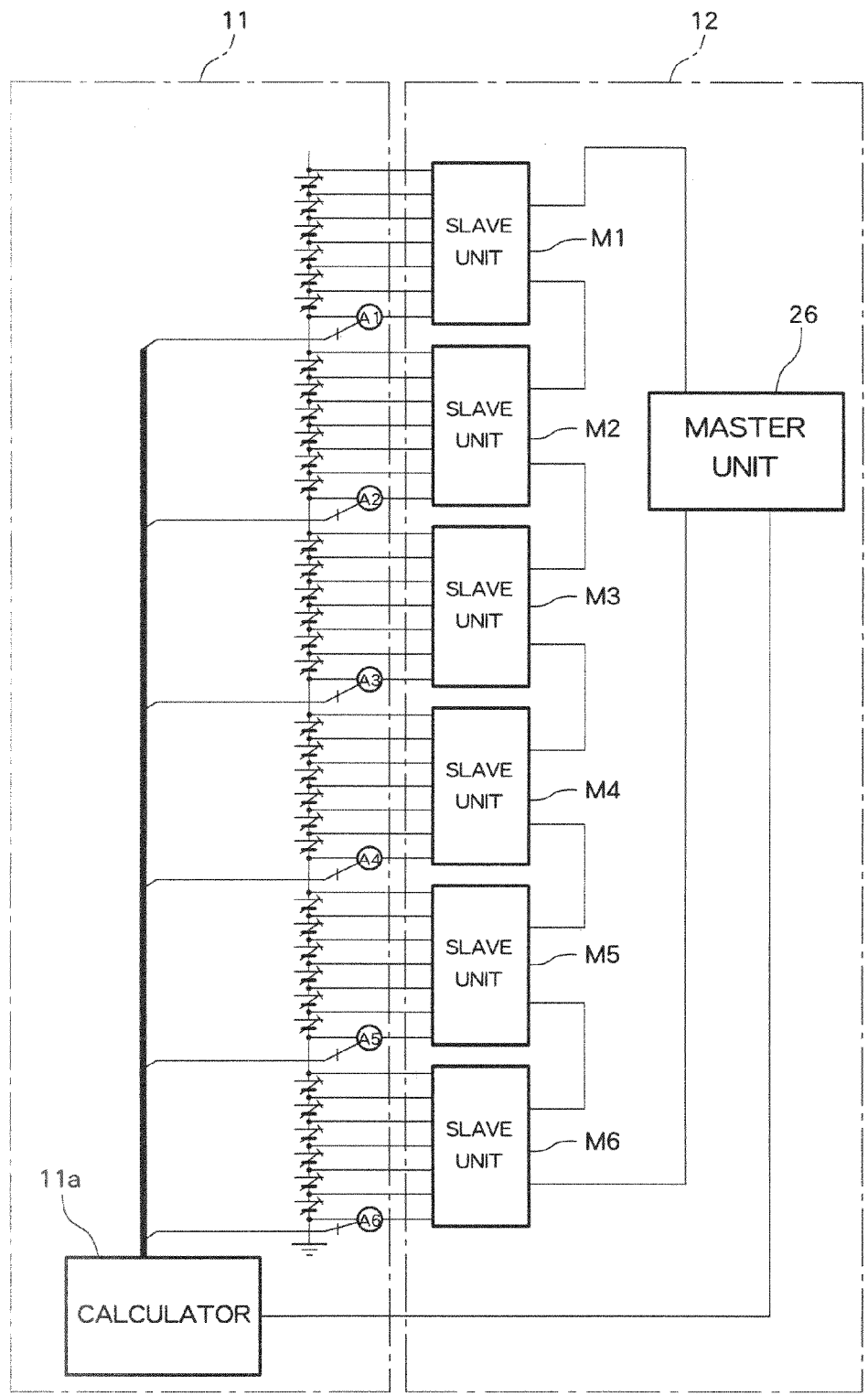
FIG. 23 is a schematic diagram of the inspection equipment and the manager.

FIG. 19 shows a processing flowchart of inspection equipment for measuring consumed current values (IDinitH and IDinitL) before shipment of a battery pack. FIG. 23 shows a schematic diagram of the manager 12 and the inspection equipment 11. The inspection equipment 11 is electrically connected to the manager 12 by way of an unillustrated connector. A calculator 11a and the master unit 26 are connected, and 36 power sources that imitate respective battery cells constituting the battery pack 10 are connected to each of the slave units M1 to M6. Six series connected power sources (e.g., power sources based on the assumption of cells having a terminal voltage of the order of 3.7 V) are connected as one block to each of the slave units, thereby supplying operation power to the corresponding slave unit. Wires for connecting each of the slave units to the power source are seven. However, as shown in FIG. 2, intermediate five wires are merely for supplying a nominal current for detecting a voltage of the power source. The top wire and the bottom wire are power lines for supplying electric power to the slave unit. Ammeters A1 to A6 are connected to points between the respective slave units M1 to M6 and the six blocks made up of the power sources imitating the battery cells and measure currents consumed by the respective slave units M1 to M6. Specifically, electric currents of the respective power lines are measured by the respective ammeters. Consumed current values of the respective slave units M1 to M6 detected by the ammeters are supplied to the calculator 11a in the inspection equipment 11. Electric power is first supplied from the power sources to the master unit 26, and an ignition ON signal is subsequently supplied to the same (S801). Next, the master unit 26 commands the respective slave units M1 to M6 to output a command signal for setting the respective control command values CLK1 to CLK6 to 0; namely, commands the respective salve units to operate by use of the free-of-frequency-division operation clock signal (S802). Consumed current values consumed by the respective slave units M1 to M6 are acquired (S803). Specifically, the respective ammeters detect consumed current values of the respective slave units M1 to M6 acquired when the slave units are operated by means of the free-of-frequency-division operation clock signal, and the thus-detected current values are sent to the calculator 11a. The calculator 11a stores the consumed current values of the respective slave units M1 to M6 in memory while assigned IDs. The consumed current values acquired at this time are taken as IDinitH1 to IDinitH6. Next, the master unit 26 commands the respective slave units M1 to M6 to output a command signal for setting the respective clock control command values CLK1 to CLK6 to a value of 1; namely, commands the slave units to operate by use of the divided-by-two operation clock signal (S804). Consumed current values of the respective slave units M1 to M6 are acquired (S805). Specifically, the respective ammeters detect consumed current values of the respective slave units M1 to M6 acquired when the slave units are operated by use of the divided-by-two operation clock signal, and the thus-detected consumed current values are sent to the calculator 11a. The calculator 11a stores the consumed current values of the respective slave units M1 to M6 in memory while assigned IDs. The consumed current values acquired at this time are taken as IDinitL1 to IDinitL6. After having acquired the consumed current values as mentioned above, the calculator 11a of the inspection equipment 11 outputs the consumed current values to the master unit 26. The master unit 26 stores the received consumed current values in memory (S806). Finally, an ignition OFF signal is supplied to the master unit 26, thereby turning off the power of the master unit 26 (S807). As mentioned above, in the present embodiment, the consumed current values (IDinitH and the IDinitL) of the respective slave units M1 to M6 are stored in the memory of the master unit 26. The high frequency operation clock signal and the low frequency operation clock signal are combined at an arbitrary ratio according to the thus-stored consumed current values, whereby a difference in state of charge among the blocks can be lessened. In the embodiment, the master unit 26 determines the ratio and sends as a command to each of the slave units M1 to M6. Therefore, each of the slave units M1 to M6 does not need to store the ratio. As shown in FIG. 23, in the present embodiment, the inspection equipment 11 is provided with the ammeter and the calculator 11a, thereby detecting current consumption of the slave units M1 to M6. However, each of the slave units M1 to M6 can also be equipped with a circuit for detecting current consumption; for instance, a circuit that is built from a shunt resistor and an analog-to-digital converter and that converts current consumption into a digital value; and memory for storing the detected consumed current value. In response to a request from the master unit 26, each of the slave units M1 to M6 can also detect its own current consumption, store the detected consumed current value into the memory, and transmit the consumed current value to the master unit 26.

Third Embodiment

Figures 20, 21:
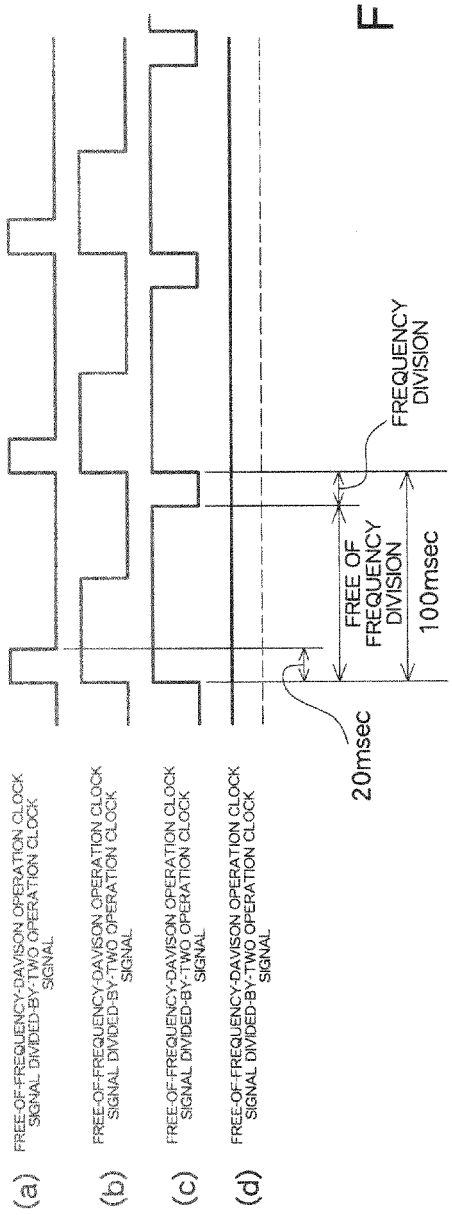
FIG. 20 shows timing charts of a battery pack manager of a third embodiment.
FIG. 21 is a descriptive view showing duty ratios set for individual slave units and consumed current values acquired at the respective duty ratios.

FIG. 20 shows timing charts of a third embodiment. In the present embodiment, a duty ratio between periods in the 100 msec control period of the master unit 26; namely, a period during which a slave unit operates by use of a free-of-frequency-division operation clock signal and a period during which a slave unit operates by means of a divided-by-two operation clock signal, is changed for each of the slave units M1 to M6 according to a difference among consumed current values (IDinitH and IDinitL) of the respective slave units M1 to M6 acquired before shipment of a battery pack, thereby lessening a difference in state of charge (SOC). FIG. 20 provides timing charts (a) to (d) having different duty ratios. The duty ratio is a percentage of a free-of-frequency-division period in the 100 msec control period. The timing chart (a)

shows that a duty ratio is 20%; (b) shows that a duty ratio is 50%; (c) shows that a duty ratio is 80%; and (d) shows that a duty ratio is 100%. The timing chart (a) involves the minimum current consumption, and the timing chart (d) involves the maximum current consumption. Therefore, a relatively small duty ratio is allocated to, among the slave units M1 to M6, a slave unit that involves relatively large current consumption IDinit before shipment. Relatively larger duty ratios are allocated to the other slave units according to a difference in current consumption IDinit, whereby a difference in state of charge (SOC) can be lessened. Specifically, the consumed current values IDinitH and IDinitL of the respective slave units M1 to M6 that were acquired when the slave units were operated by means of the free-of-frequency-division operation clock signal and the divided-by-two operation control signal and that were measured by use of the inspection equipment before shipment are stored in the memory of the master unit 26. The master unit 26 sets; for instance, a duty ratio 25% for a slave unit that involves the maximum current consumption when operated by means of the free-of-frequency-division operation control signal; for instance, the slave unit M6. There are output control command values CLK in such a way that the other slave units operate at a duty ratio at which average current consumption of the other slave units become identical with or substantially identical with average current consumption of the slave unit M6 acquired when the salve unit M6 operates at a duty ratio 25%. Since the average current consumption of the slave unit M6 is target current consumption of the other slave units, a duty ratio of the other slave units is determined by the following expression on the assumption that the average current consumption is taken as IDtarget.

A duty ratio=(IDtarget−IDinitL)/(IDinitH−IDinitL)×100

FIG. 21 shows example duty ratios assigned to the respective slave units M1 to M6. The drawing illustrates current consumption IDinitH and IDinitL of the respective slave units M1 to M6 acquired before shipment, duty ratios, and average current consumption acquired when the slave units operated at the duty ratios. For instance, a duty ratio 91.7% and average current consumption of 0.875 mA are allocated to the slave unit M1. A duty ratio 77.6% and average current consumption of 0.875 mA are allocated to the slave unit M2. A duty ratio 25% and average current consumption of 0.875 mA are allocated to the slave unit M6. All of the slave units M1 to M6 exhibit the same average current consumption, and the difference in state of charge (SOC) is thereby lessened.

Figure 22:
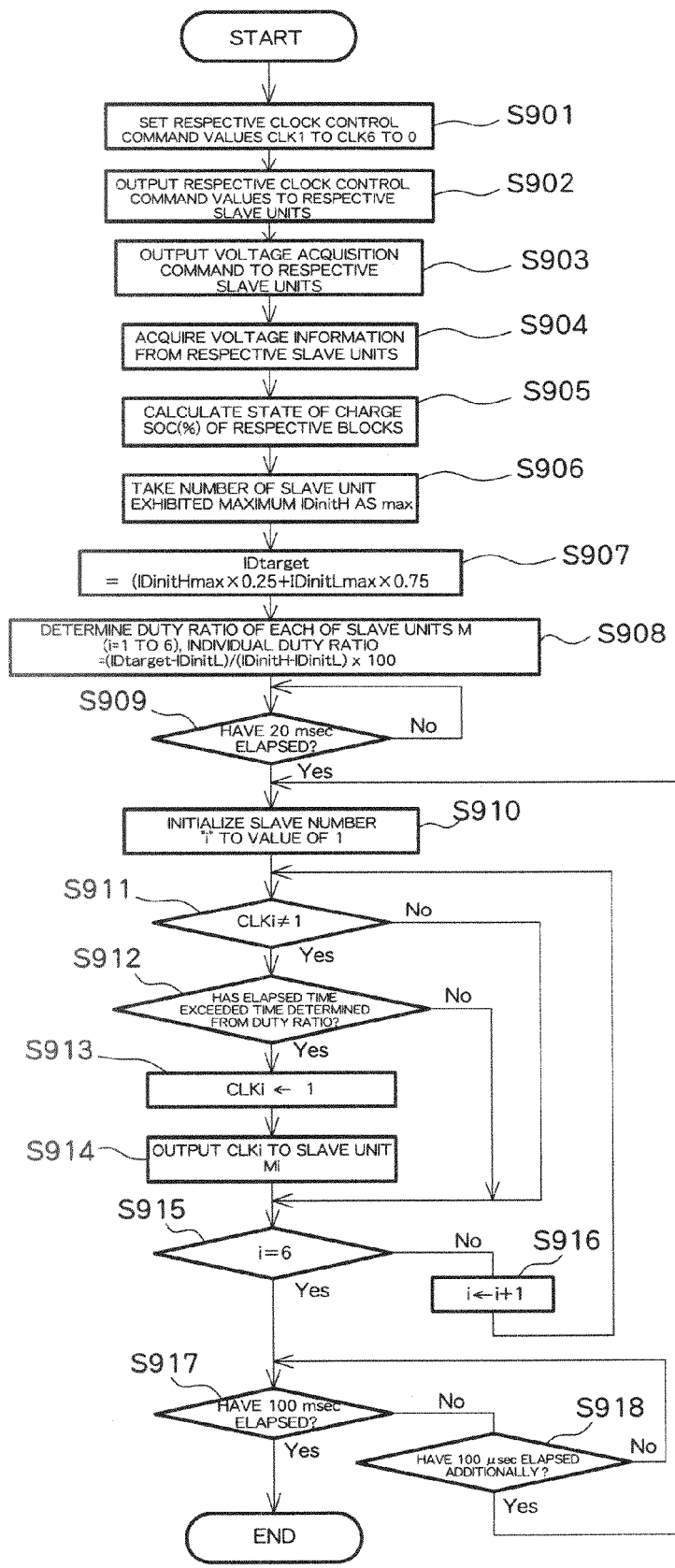
FIG. 22 is a processing flowchart of the master unit of the third embodiment.

FIG. 22 shows a processing flowchart of the master unit 26 of the present embodiment. This is processing performed very 100 msec control period. First, the master unit 26 sets the clock control command values CLK1 to CLK6 of the respective slave units M1 to M6 to 0; namely, commands outputting of free-of-frequency-division clock signals (S901). The clock control command values CLK1 to CLK6 are output to the respective slave units M1 to M6 (S902). Next, the voltage acquisition command is output to the respective slave units M1 to M6 (S903), and voltage information is acquired from the respective slave units M1 to M6 (S904). States of charge (SOC) of the respective blocks B1 to B6 are calculated from the acquired voltage information (S905).

The master unit 26 takes, as "max," a number for identifying a slave unit Mi exhibited the maximum consumed current value IDinitH before shipment (S906). For instance, the slave unit M6 is herein assumed to have exhibited the maximum consumed current value. The target average consumed current value IDtarget is calculated (S907). Specifically, as mentioned above, there is calculated an average consumed current value acquired when the duty ratio of the slave unit (the slave unit M6) exhibiting the maximum consumed current value IDinitH is set to 25%. On the assumption that the slave unit exhibiting the maximum consumed current value IDinitH exhibits a consumed current value IDinitHmax when operated by means of the free-of-frequency-division operation clock signal and a consumed current value IDinitLmax when operated by means of the divided-by-two operation clock signal, the target average consumed current value IDtarget is calculated by the following equation.

IDtarget=(IDinitHmax×0.25+IDinitLmax×0.75)

A duty ratio of each of the slave units M1 to M6 is calculated (S908); specifically, by means of the following expression:

A duty ratio=(IDtarget−IDinitL)/(IDinitH−IDinitL)×100

Next, after initiation of the 100 msec control period, it is determined whether or not 20 msec have elapsed (S909). A number "i" assigned to the slave unit is initialized at a point in time when 20 msec have elapsed (S910), and a determination is made as to whether or not the clock control command value CLKi of the salve unit Mi is 1 (S911). When a clock control command value CLKi is not 1; namely, when the slave unit is still operating by means of the free-of-frequency-division operation clock signal, it is determined whether or not an elapsed time has come to or surpassed a time determined from a duty ratio of the slave unit (S912). In the case of; for instance, the slave unit M1, the duty ratio of the slave unit M1 is 91.7% as shown in FIG. 21, and it is determined whether or not 91.7 msec of 100 msec have elapsed. Likewise, in the case of the slave unit M2, the duty ratio of the slave unit M2 is 77.6%. Therefore, it is determined whether or not 77.6 msec of 100 msec have elapsed. When the determined time has elapsed, the clock control command value CLKi of the slave unit M1 is set to a value of 1 (S913), and the clock control command value CLKi is output to the slave unit Mi (S914). When NO is selected in S911; namely, when the clock control command value CLKi of the slave unit Mi is already 1, the master unit 26 does not output the clock control command value CLKi to the slave unit. Specifically, the master unit 26 outputs the clock control command value CLKi solely to the slave unit that is to be changed from a free-of-frequency-division state to a state of division by two. Foregoing processing is performed for all of the slave units M1 to M6 (S915 and S916). The reason why a determination is made in S915 as to whether the number "i" is 6 is because the total number of slave units M1 to M6 is 6.

It is then determined whether or not the 100 msec control period has elapsed (S917). When 100 msec have not elapsed, it is determined whether or not 100 μsec have additionally elapsed (S918). When 100 μsec have elapsed, processing subsequent to S910 is again repeatedly performed. This is intended for checking the timer every 100 μsec.

As above, current consumption of the slave units M1 to M6 is averaged, and a difference in state of charge (SOC) among the blocks B1 to B6 can be lessened. In the present embodiment, a difference among the blocks can be lessened by changing the duty ratio that is a percentage of the free-of-frequency-division period of the control period, as mentioned above. Therefore, the difference can be lessened more flexibly and with higher accuracy.

Although the embodiments of the present invention have been described thus far, the state of charge SOC (%) described in connection with the embodiments can also be changed to remaining capacity (Ah).

Further, the present embodiments have in principle described equalization processing performed during turning on of the ignition. However, equalization processing can also be performed likewise even during turning off of the ignition by switching the frequency of the operation clock signals for the respective slave units M1 to M6 (e.g., by switching the operation clock signals to high frequency signals).

What is claimed is:

1. A manager that manages a state of charge of a battery pack, comprising:
   a plurality of low level control means that each individually control a plurality of series-connected battery blocks constituting the battery pack and that are supplied with electric power from each of the plurality of battery blocks; and
   high level control means that generates each of operation clock signals for the plurality of low level control means from at least two signals, a high frequency signal and a low frequency signal, and that lessens a difference in state of charge among the battery blocks to be controlled by the plurality of corresponding low level control means by controlling an appearance ratio of the high frequency signal to the low frequency signal.

2. The manager according to claim 1, wherein
   the plurality of low level control means detect terminal voltage of battery cells constituting each of the battery blocks to be controlled by the respective low level control means and supply the detected terminal voltages to the high level control means; and
   the high level control means detects a difference in state of charge from the terminal voltages of the battery blocks and control the appearance ratio according to the difference in state of charge.

3. The manager according to claim 2, wherein the high level control means performs control operation so as to increase the appearance ratio of the high frequency signal in connection with low level control means that controls a battery block exhibiting a relatively higher state of charge.

4. The manager according to claim 1, wherein the high level control means controls the appearance ratio according to a difference among consumed current values generated as a result of the plurality of low level control means operating by means of the high frequency signal.

5. The manager according to claim 4, wherein the high level control means performs control operation in such a way that low level control means exhibiting a relatively greater consumed current value is given a larger appearance ratio of the low frequency signal.

6. The manager according to claim 5, wherein the high level control means sets the appearance ratio of the low level control means, among the plurality of low level control means, that exhibits a relatively greater consumed current value generated as a result of the low level control means having operated by means of the high frequency signal and also sets the appearance ratio for the other low level control means such that a difference between an average consumed current value generated as a result of the low level control means having operated by means of the set appearance ratio and an average consumed current value of the other low level control means becomes minimum.

7. The manager according to claim 1, wherein the high level control means controls the appearance ratio by means of taking the operation clock signal appearing in a first period "t" of a control period T (t<T) as the high frequency signal and the operation clock signal appearing in a remaining T−t period as either the high frequency signal or the low frequency signal.

8. The manager according to claim 1, wherein the low frequency signal is a signal generated by frequency division of the high frequency signal.

9. A manager for managing remaining capacity of a battery pack comprising:
   a plurality of low level control means that each individually control a plurality of series-connected battery blocks constituting the battery pack and that are supplied with electric power from each of the plurality of battery blocks; and
   high level control means that generates each of operation clock signals for the plurality of low level control means from at least two signals, a high frequency signal and a low frequency signal, and that lessens a difference in remaining capacity among the battery blocks to be controlled by the plurality of corresponding low level control means by controlling an appearance ratio of the high frequency signal to the low frequency signal.

* * * * *